United States Patent
Ikeuchi et al.

(10) Patent No.: US 8,059,377 B2
(45) Date of Patent: Nov. 15, 2011

(54) PROTECTION DEVICE, PROTECTION METHOD USING THE SAME, METHOD FOR PROCESSING SIGNAL USING THE SAME, AND METHOD FOR DETECTING QUANTITY OF ELECTRICITY USING THE SAME

(75) Inventors: Yoshitaka Ikeuchi, Kanagawa (JP); Tomoya Shigemi, Osaka (JP); Takuya Ishii, Osaka (JP); Noboru Nakashima, Kanagawa (JP)

(73) Assignee: Panasonic Corporation, Osaka (JP)

( * ) Notice: Subject to any disclaimer, the term of this patent is extended or adjusted under 35 U.S.C. 154(b) by 595 days.

(21) Appl. No.: 12/063,637

(22) PCT Filed: Jun. 21, 2007

(86) PCT No.: PCT/JP2007/062486
§ 371 (c)(1),
(2), (4) Date: Feb. 12, 2008

(87) PCT Pub. No.: WO2008/004445
PCT Pub. Date: Jan. 10, 2008

(65) Prior Publication Data
US 2009/0257164 A1    Oct. 15, 2009

(30) Foreign Application Priority Data

Jul. 6, 2006  (JP) .................................. 2006-186689

(51) Int. Cl.
*H02H 3/00* (2006.01)
*H02H 5/04* (2006.01)
(52) U.S. Cl. .............. 361/78; 361/86; 361/87; 361/93.8
(58) Field of Classification Search .................... 361/78, 361/79, 86–103
See application file for complete search history.

(56) References Cited

U.S. PATENT DOCUMENTS

| | | | |
|---|---|---|---|
| 5,557,385 A * | 9/1996 | Tanaka et al. .................. 399/69 |
| 6,948,078 B2 * | 9/2005 | Odaohhara .................. 713/300 |
| 7,554,300 B2 * | 6/2009 | Furukawa et al. ............. 320/150 |
| 2003/0002899 A1 * | 1/2003 | Furukawa et al. ....... 400/120.01 |
| 2004/0000713 A1 | 1/2004 | Yamashita et al. |

FOREIGN PATENT DOCUMENTS

| | | |
|---|---|---|
| JP | 9-83742 | 3/1997 |
| JP | 11-289656 | 10/1999 |
| JP | 11-319395 | 11/1999 |
| JP | 2001-022451 | 1/2001 |
| JP | 2004-24551 | 1/2004 |
| JP | 2004-248415 | 9/2004 |
| JP | 2005-051931 | 2/2005 |
| JP | 2006-033411 | 2/2006 |

* cited by examiner

*Primary Examiner* — Rexford Barnie
*Assistant Examiner* — Christopher Clark
(74) *Attorney, Agent, or Firm* — McDermott Will & Emery LLP

(57) ABSTRACT

A protection device detects a temperature in a predetermined monitoring place in an electronic apparatus 3 to protect the electronic apparatus 3, and includes an oscillating circuit 20 for generating a clock signal Vck having a predetermined cycle and a predetermined ON time, and a temperature detection circuit 16 for detecting the temperature in the monitoring place during the ON time of the clock signal Vck. The protection device shuts off supply of electric power to the electronic apparatus 3, when the temperature in the monitoring place exceeds a predetermined temperature.

19 Claims, 12 Drawing Sheets

US 8,059,377 B2

PROTECTION DEVICE, PROTECTION METHOD USING THE SAME, METHOD FOR PROCESSING SIGNAL USING THE SAME, AND METHOD FOR DETECTING QUANTITY OF ELECTRICITY USING THE SAME

RELATED APPLICATIONS

This application is the U.S. National Phase under 35 U.S.C. §371 of International Application No. PCT/JP2007/062486, filed on Jun. 21, 2007, which in turn claims the benefit of Japanese Patent Application No. JP 2006-186689, filed on Jul. 6, 2006, the disclosures of which Applications are incorporated by reference herein.

TECHNICAL FIELD

The present invention relates to a protection device, a protection method using the same, a method for processing a signal using the same, and a method for detecting a quantity of electricity using the same, the protection device detecting an abnormal temperature, an abnormal current, or the like of an electronic apparatus to protect the electronic apparatus by shutting off supply of electric power to the electronic apparatus.

BACKGROUND ART

In recent years, an electronic apparatus typified by a mobile phone operates using electric power supplied from an external power source such as a battery or an AC (alternating current) adapter. Upon detecting an abnormal state in the electronic apparatus, a protection device of such an electronic apparatus generally shuts off supply of electric power from the external power source.

Such conventional protection device is disclosed in Patent Document 1, for example. FIG. 12 generally shows a protection device disclosed in Patent Document 1. The protection device according to Patent Document 1 uses a lithium-ion battery 80 as an external power source and includes an NMOS (n-type metal-oxide-semiconductor) transistor 81 for controlling a discharging current of the lithium-ion battery 80 and an NMOS transistor 82 for controlling a charging current of the lithium-ion battery 80.

In order to control the discharging current from the lithium-ion battery 80, a control circuit 83 outputs a signal V1 for controlling the NMOS transistor 81. In order to control the charging current to the lithium-ion battery 80, the control circuit 83 outputs a signal V2 for controlling the NMOS transistor 82. A temperature detection circuit 84 detects an ambient temperature of the NMOS transistor 81, and a temperature detection circuit 85 detects an ambient temperature of the NMOS transistor 82. The temperature detection circuits 84 and 85 output "H (high)" level signals, when the detected temperature is higher than or equal to a predetermined value, for example, 100° C.

When an output from the temperature detection circuit 84 is at a "L (low)" level, an NMOS transistor 86 connected between the gate and the source of the NMOS transistor 81 is in the OFF state, allowing the signal V1 to be applied to the gate of the NMOS transistor 81. Meanwhile, when the output from the temperature detection circuit 84 is at a "H" level, the NMOS transistor 86 is in the ON state, grounding the gate of the NMOS transistor 81 to turn OFF the NMOS transistor 81. That is, the ambient temperature of the NMOS transistor 81 exceeding a predetermined value is determined to be an abnormal state, and thus the discharging current from the lithium-ion battery 80 is shut off.

When an output from the temperature detection circuit 85 is at a "L" level, an NMOS transistor 87 connected between the gate and the source of the NMOS transistor 82 is in the OFF state, allowing the signal V2 to be applied to the gate of the NMOS transistor 82. Meanwhile, when the output from the temperature detection circuit 85 is at a "H" level, the NMOS transistor 87 is in the ON state, grounding the gate of the NMOS transistor 82 to turn OFF the NMOS transistor 82. That is, the ambient temperature of the NMOS transistor 82 exceeding a predetermined value is determined to be an abnormal state, and thus the charging current to the lithium-ion battery 80 is shut off.

While the NMOS transistor 81 and the NMOS transistor 82 are in the ON state, a voltage of the lithium-ion battery 80 is supplied via power source terminals 88 and 89 to the electronic apparatus.

[Patent Document 1] Japanese Laid-Open Patent Publication No. 11-289656

DISCLOSURE OF INVENTION

Problems to be Solved by the Invention

However, the above-mentioned conventional protection device detects only an ambient temperature of a switching element which turns ON/OFF power source supply. As an electronic apparatus of recent years typified by a mobile phone has been multifunctionalized and increased in electric power consumption, the number of places where a temperature, a current, or a voltage has to be monitored has been increased. Therefore, there is a problem that electric power consumption increases for detecting temperatures and quantities of electricity in a plurality of places.

An object of the present invention is to realize a protection device in which the above-mentioned conventional problem is solved and the electric power consumption can be reduced even if a plurality of temperature detection circuits or circuits for detecting a quantity of electricity are provided.

Means for Solving the Problems

To achieve the above-mentioned object, a protection device of the present invention is configured to perform detection operation in synchronism with a clock signal which is repeatedly turned ON/OFF in a predetermined cycle.

Specifically, a first protection device according to the present invention is directed to a protection device for detecting a temperature, a voltage, or a current in a predetermined monitoring place in an electronic apparatus supplied with electric power from an external power source to protect the electronic apparatus from an excessive temperature, an overvoltage, or an overcurrent, the protection device comprising: a detection element arranged in the monitoring place for detecting the temperature, the voltage, or the current of the electronic apparatus to output an electric signal; an oscillating circuit for generating a clock signal having a predetermined cycle and a predetermined ON time; and a detection circuit for detecting the electric signal during the ON time of the clock signal, the electric signal being generated in the detection element, wherein supply of the electric power to the electronic apparatus is shut off according to an output signal output from the detection circuit.

According to the first protection device, since the detection operation is performed only during the ON time within a predetermined cycle synchronous with the clock signal, it is possible to reduce electric power consumption compared to the conventional protection device in which the detection operation is continuously performed. Therefore, even if the detection operation is performed in a plurality of monitoring places in the electronic apparatus, it is possible to suppress the increase in electric power consumption.

It is preferable that the first protection device further includes a switching circuit for controlling the supply of the electric power to the electronic apparatus, the switching circuit being provided for an electric power supply line between the external power source and the electronic apparatus, wherein the detection element is a temperature detection element for detecting a temperature of the switching circuit to output the electric signal according to the detected temperature, and the switching circuit is turned off according to the output signal of the detection circuit.

Moreover, it is preferable that the first protection device further includes a switching circuit for controlling the supply of the electric power to the electronic apparatus, the switching circuit being provided for an electric power supply line between the external power source and the electronic apparatus, wherein the detection element is a temperature detection element for detecting a temperature of an element constituting the electronic apparatus to output the electric signal according to the detected temperature, and the switching circuit is turned off according to the output signal of the detection circuit.

Moreover, it is preferable that the first protection device includes a switching circuit for controlling the supply of the electric power to the electronic apparatus, the switching circuit being provided for an electric power supply line between the external power source and the electronic apparatus, wherein the detection element is a voltage detection element which is connected to the electric power supply line for detecting a voltage of the electric power supply line to output the electric signal according to the detected voltage, and the switching circuit is turned off according to the output signal of the detection circuit.

Moreover, it is preferable that the first protection device further includes a switching circuit for controlling the supply of the electric power to the electronic apparatus, the switching circuit being provided for an electric power supply line between the external power source and the electronic apparatus, wherein the detection element is a current detection element which is connected to the electric power supply line for detecting a current responsive to an output current of the external power source to output the electric signal according to the detected current, and the switching circuit is turned off according to the output signal of the detection circuit.

It is preferable that the first protection device further includes a protection control circuit for generating the electric signal during the ON time of the clock signal, the electric signal being input to the detection element, wherein the detection element includes detection elements arranged in N (N is an integer greater than or equal to 2) detection places, and the protection control circuit drives the detection elements according to N different phases synchronous with the clock signal.

In this case, it is preferable that the protection control circuit includes a divider circuit for dividing the clock signal by at least N. With this configuration, since the detection operation can be sequentially performed in N places according to N cycles obtained by dividing the clock signal by N, the detection operation can be certainly performed in a plurality of places while reducing the electric power consumption.

It is preferable that the first protection device further includes a judging circuit which includes a comparison circuit for comparing the output signal of the detection circuit with a reference signal serving as a reference and outputting a result of the comparison, wherein the judging circuit counts an output signal of the comparison circuit, and when a result of the count exceeds a predetermined number of times, the judging circuit shuts off the supply of the electric power to the electronic apparatus.

With this configuration, it is possible to protect improper operation of the protection device caused by extraneous noise or the like.

In this case, it is preferable that the judging circuit further includes: a delay circuit for outputting a signal obtained by delaying the clock signal for a predetermined time; the detection circuit for intermittently supplying a current to the detection element according to the clock signal to output a signal generated in the detection element; a logical circuit for performing logical AND operation of the output signal of the comparison circuit and the signal output from the delay circuit; and a counter circuit whose reset terminal receives an output signal of the logical circuit and whose clock input terminal receives the output signal of the comparison circuit for count operation, wherein the supply of the electric power to the electronic apparatus is shut off according to an output signal of the counter circuit.

It is preferable that the first protection device further includes recording means for recording a current, a voltage, or a current at which the supply of the electric power to the electronic apparatus is shut off.

With this configuration, it is possible to analyze in which operational environment the electronic apparatus has been used.

In this case, it is preferable that the recording means records a bigger one of data detected by the detection circuit and data in the recording means.

Moreover, it is preferable that the first protection device further includes a central processing unit, wherein the recording means operates according to a signal given from the central processing unit.

With this configuration, data for a period when abnormality has been occurred is easily collected.

In this case, it is preferable that transmission means for externally transmitting an internal signal held in the central processing unit is further provided.

Moreover, in this case, it is preferable that the central processing unit is connected to a first power source which is detachably provided, and the recording means is connected to a second power source which is provided independently of the first power source.

A second protection device according to the present invention is directed to a protection device for detecting temperatures, voltages, or currents in predetermined monitoring places in a first electronic apparatus and a second electronic apparatus to protect the electronic apparatuses from an excessive temperature, an overvoltage, or an overcurrent, the protection device including: an oscillating circuit for generating a clock signal having a predetermined cycle and a predetermined ON time; a detection circuit for detecting the temperatures, the voltages, or the currents in the predetermined monitoring places during the ON time of the clock signal; and a switching circuit for shutting off supply of electric power to the electronic apparatuses according to an output signal of the detection circuit; wherein the oscillating circuit and the detection circuit are integrated to constitute an integrated circuit, the integrated circuit and the first electronic apparatus are mounted on a first substrate, the second electronic apparatus is mounted on a second substrate, the first substrate is supplied with the electric power from an external power source for the first substrate, and the second substrate is supplied with the electric power from an external power source for the second substrate, and at least one of the integrated circuit, the first electronic apparatus, the second electronic apparatus, the external power source for the first substrate, and the external power source for the second substrate is one of the monitoring places.

According to the second protection device, even if the protection device excepting the detection element, for example, a thermistor, is downsized (formed on one chip) through integration and the electronic apparatuses are mounted on the plurality of substrates, it is possible to certainly detect temperatures in the plurality of monitoring places of the electronic apparatuses.

A protection method using a protection device according to the present invention is directed to a protection method using a protection device for detecting a temperature, a voltage, or a current in a predetermined monitoring place in an electronic apparatus to protect the electronic apparatus from an excessive temperature, an overvoltage, or an overcurrent, the protection device including: a detection element arranged in the monitoring place for detecting a value of the temperature, the voltage, or the current in the monitoring place; a clock generation circuit for generating a clock signal which is output from the clock generation circuit, the clock signal having a predetermined cycle and a predetermined ON time; and a current source for outputting a signal current during the ON time of the clock signal, the protection method comprising the steps of: collecting a quantity of electricity generated by applying the signal current to the detection element; and protecting the electronic apparatus according to the collected quantity of the electricity.

According to the protection method using the protection device of the present invention, since the detection operation is performed intermittently, that is, only during the ON time within a predetermined cycle synchronous with the clock signal, it is possible to reduce the electric power consumption compared to the conventional protection device in which the detection operation is continuously performed. Therefore, even if the detection operation is performed in a plurality of monitoring places in the electronic apparatus, it is possible to suppress the increase in electric power consumption.

A method for processing a signal using a protection device according to the present invention is directed to a method for processing a signal using a protection device for detecting a temperature, a voltage, or a current in a predetermined monitoring place in an electronic apparatus to protect the electronic apparatus from an excessive temperature, an overvoltage, or an overcurrent, the method comprising the steps of: generating a clock signal having a predetermined cycle and a predetermined ON time; detecting the temperature, the voltage, or the current in the monitoring place during the ON time of the clock signal; shutting off supply of electric power to the electronic apparatus according to an output signal of a detection circuit; and recording output data from temperature detection means, voltage detection means, or current detection means at a time when the supply of the electric power is shut off according to the output signal of the detection circuit.

According to the method for processing a signal by the protection device of the present invention, even if the detection operation is performed in a plurality of monitoring places in the electronic apparatus, it is possible to suppress the increase in electric power consumption. Moreover, it is possible to analyze in which operational environment the electronic apparatus has been used.

It is preferable that the method for processing the signal using the protection device according to the present invention further includes the step of transferring the output data to a central processing unit provided outside.

A method for detecting a quantity of electricity using a protection device according to the present invention is directed to a method for detecting a quantity of electricity using a protection device for detecting a temperature, a voltage, or a current in a predetermined monitoring place in an electronic apparatus to protect the electronic apparatus from an excessive temperature, an overvoltage, or an overcurrent, the protection device including: a detection element arranged in the monitoring place for detecting a value of the temperature, the voltage, or the current in the monitoring place; a clock generation circuit for generating a clock signal which is output from the clock generation circuit, the clock signal having a predetermined cycle and a predetermined ON time; and a current source for outputting a signal current during the ON time of the clock signal, the method comprising the steps of: (a) applying the signal current to the detection element; and (b) detecting the quantity of the electricity generated from the detection element due to the application of the signal current.

According to the method for detecting the quantity of electricity using the protection device of the present invention, even if the detection operation is performed in a plurality of monitoring places in the electronic apparatus, it is possible to suppress the increase in the electric power consumption.

In the method for detecting the quantity of the electricity using the protection device according to the present invention, it is preferable that the monitoring place includes a plurality of monitoring places provided in the electronic apparatus, the detection element includes a plurality of detection elements respectively arranged in the plurality of monitoring places, step (a) includes sequentially applying the signal current from the current source to the plurality of the detection elements; and step (b) includes sequentially detecting the quantity of the electricity generated from each of the detection elements due to the sequential application of the signal current.

EFFECTS OF THE INVENTION

According to the protection device and the method for driving the same of the present invention, since the detection operation is performed in synchronism with the clock signal, electric power required for detecting abnormality, that is, the electric power consumption can be reduced.

Figure 1:
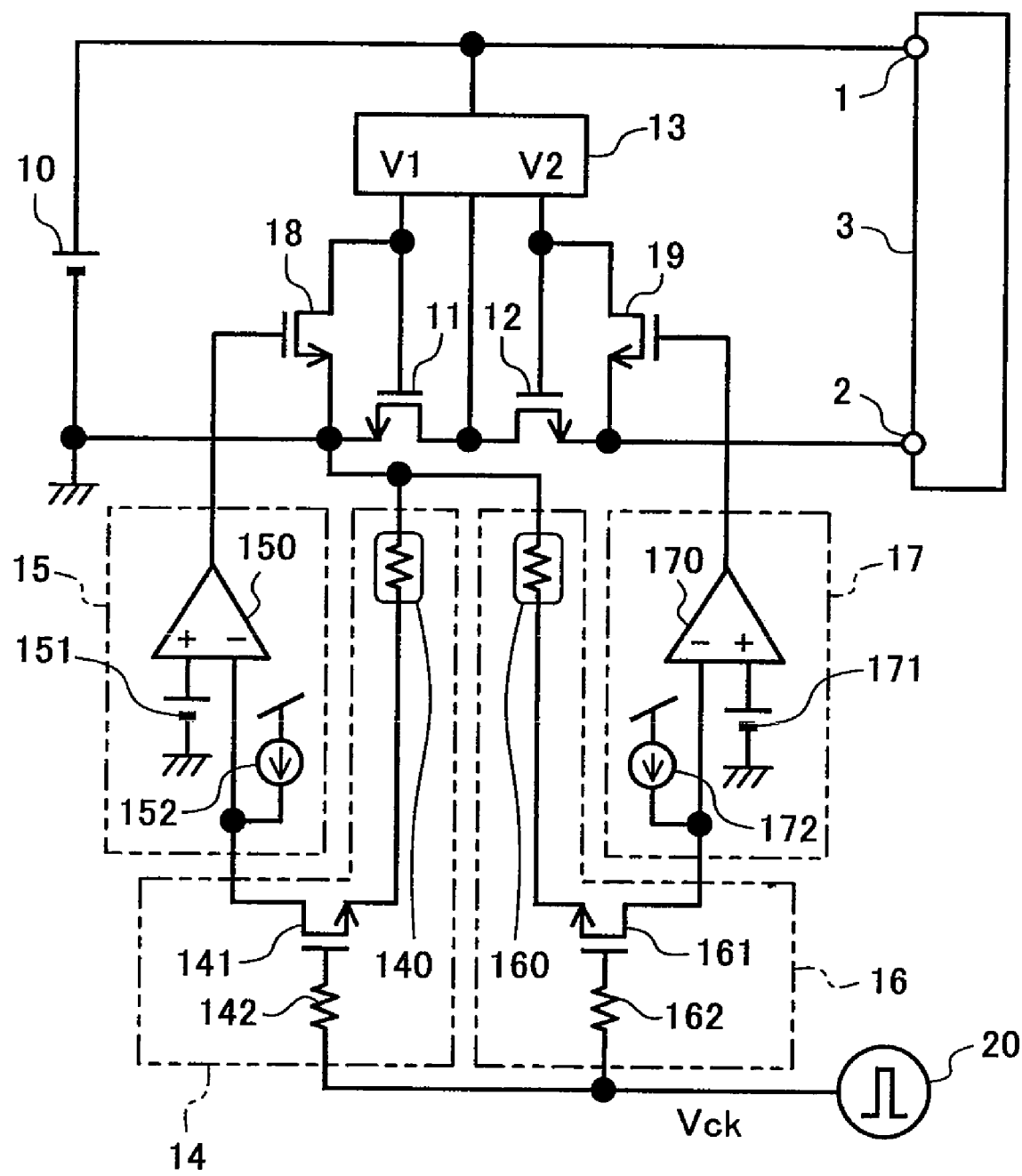
FIG. 1 is a circuit diagram illustrating a protection device according to Embodiment 1 of the present invention.

DESCRIPTION OF REFERENCE NUMERALS 1 first power source terminal
2 second power source terminal
3 electronic apparatus
3a electronic apparatus
3b electronic apparatus
3c electronic apparatus
4 external power source
5 charging device
10 battery
10A first battery
10B second battery
10C third battery
11 first NMOS transistor
12 second NMOS transistor
13 control circuit
14 first temperature detection circuit
140 first thermistor
141 fifth NMOS transistor
142 first drive resistor
15 first comparison circuit
150 first comparator
151 first reference voltage source
152 constant current source
16 second temperature detection circuit
160 second thermistor
161 sixth NMOS transistor
162 second drive resistor
17 second comparison circuit
170 second comparator
171 second reference voltage source
172 constant current source
18 third NMOS transistor
19 fourth NMOS transistor
20 oscillating circuit
21 first PMOS transistor
21a third PMOS transistor
22 control circuit
22a second control circuit
23 temperature detection circuit
23A detection circuit
231 first thermistor
232 second thermistor
233 third thermistor
234 fourth thermistor
234a fifth thermistor
234b sixth thermistor
235 first NMOS transistor
236 second NMOS transistor
237 third NMOS transistor
238 fourth NMOS transistor
239 first detection resistor
24 comparison circuit
24A comparison circuit
24B comparison circuit
240 first NMOS transistor
241 third PMOS transistor
242 fourth PMOS transistor
243 first resistor
244 first comparator
245 reference voltage source
246 NOR circuit
247 second detection resistor
248 second NMOS transistor
249 Zener diode
25 second PMOS transistor
25a fourth PMOS transistor
251 fifth PMOS transistor
252 sixth PMOS transistor
253 second resistor
254 second comparator
26 oscillating circuit
27 divider circuit (protection control circuit)
28 judging circuit
28a first comparison circuit
280 comparator
281 reference voltage source
282 constant current source
283 delay circuit
284 inverter
285 AND circuit
286 counter circuit
287 NOR circuit
29 current detection circuit (circuit for detecting a quantity of electricity)
31 AD converter
31a AD converter
31A AD converter
32 register
32a register
33 CPU
34 interface device
35 personal computer
10A protection device (integrated circuit)
101B protection device (integrated circuit)
101C protection device (integrated circuit)
101D protection device (integrated circuit)
102 wiring
102A wiring
102B wiring pattern
121 first IC chip
122 second IC chip
123 third IC chip
124 fourth IC chip
125 fifth IC chip
300 mounting substrate
301 first mounting substrate
302 second mounting substrate
303 third mounting substrate
400 integrated circuit (protection device)
401 voltage detection protection circuit
402 current detection protection circuit
403 temperature detection protection circuit
404 protection control circuit 405 analog output circuit
410 thermistor
420 external power source
430 battery
440 charging device
450 first switch
460 second switch
470 resistor
480 external device
481 AD converter
482 CPU

BEST MODE FOR CARRYING OUT THE
INVENTION

Embodiment 1

Embodiment 1 according to the present invention will be described with reference to the drawings.

FIG. 1 shows a circuit configuration of a protection device according to Embodiment 1 of the present invention. As shown in FIG. 1, the protection device according to Embodiment 1 performs protection operation for an electronic apparatus 3 which has a first power source terminal 1 and a second power source terminal 2, wherein the first power source terminal 1 is connected to a positive electrode of a battery 10 serving as an external power source, and the second power source terminal 2 is connected to a grounded negative electrode of the battery 10 via a first NMOS transistor 11 and a second NMOS transistor.

The first NMOS transistor 11 controls a discharging current of the battery 10, and the second NMOS transistor 12 controls a charging current of the battery 10. The gate of the first NMOS transistor 11 receives a first signal V1 for controlling the first NMOS transistor 11 from a control circuit 13 connected to the positive electrode of the battery 10. The gate of the second NMOS transistor 12 receives a second signal V2 for controlling the second NMOS transistor 12 from the control circuit 13.

The protection device includes: a third NMOS transistor 18 connected between the gate and the source of the first NMOS transistor 11; a first temperature detection circuit 14 having a first thermistor 140; a first comparison circuit 15 for feeding a constant current to the first temperature detection circuit 14 and comparing a voltage drop across the first thermistor 140 with a reference voltage to turn ON/OFF the third NMOS transistor 18 depending on a result of the comparison; a fourth NMOS transistor 19 connected between the gate and the source of the second NMOS transistor 12; a second temperature detection circuit 16 having a second thermistor 160; a second comparison circuit 17 for feeding a constant current to the second temperature detection circuit 16 and comparing a voltage drop across the second thermistor 160 with a reference voltage to turn ON/OFF the fourth NMOS transistor 19 depending on a result of the comparison; and an oscillating circuit 20 for generating a clock signal Vck which is output to the first temperature detection circuit 14 and the second temperature detection circuit 16, wherein the clock signal Vck repeatedly changes between high and low levels in a cycle Ts. Here, a period when the clock signal Vck is at a "H" level is understood to be an ON time Ton.

Specifically, the first temperature detection circuit 14 includes the first thermistor 140 one terminal of which is grounded, and a fifth NMOS transistor 141. The fifth NMOS transistor 141 has the source connected to the other terminal of the first thermistor 140, the gate for receiving the clock signal Vck via a first drive resistor 142, and the drain for receiving the constant current from the first comparison circuit 15. To detect an ambient temperature of the first NMOS transistor 11, the first thermistor 140 is arranged near the first NMOS transistor 11 and fed with a current via the fifth NMOS transistor 141.

The first comparison circuit 15 includes a first comparator 150 which has a positive phase terminal for receiving the reference voltage from a first reference voltage source 151 and a negative phase terminal connected to a first constant current source 152. The first constant current source 152 feeds the constant current to the first thermistor 140 via the fifth NMOS transistor 141 in the first temperature detection circuit 14 and compares the voltage drop across the first thermistor 140 with the reference voltage of the first reference voltage source 151.

Likewise, the second temperature detection circuit 16 includes a sixth NMOS transistor 161 and the second thermistor 160 one terminal of which is grounded. The sixth NMOS transistor 161 has the source connected to the other terminal of the second thermistor 160, the gate for receiving the clock signal Vck via a second drive resistor 162, and the drain for receiving the constant current from the second comparison circuit 17. To detect an ambient temperature of the second NMOS transistor 12, the second thermistor 160 is arranged near the second NMOS transistor 12 and fed with a current via the sixth NMOS transistor 161.

The second comparison circuit 17 includes a second comparator 170 which has a positive phase terminal for receiving the reference voltage from a second reference voltage source 171 and a negative phase terminal connected to a second constant current source 172. The second constant current source 172 feeds the constant current to the second thermistor 160 via the sixth NMOS transistor 161 in the second temperature detection circuit 16 and compares the voltage drop across the second thermistor 160 with the reference voltage of the second reference voltage source 171.

Operation of the protection device having the above-mentioned configuration according to Embodiment 1 of the present invention will be described below.

First, when the clock signal Vck is at a "L" level, both the fifth NMOS transistor 141 in the first temperature detection circuit 14 and the sixth NMOS transistor 161 in the second temperature detection circuit 16 are in the OFF state, and thus the first thermistor 140 and the second thermistor 160 are not fed with currents. Therefore, since detection currents of the first comparison circuit 15 and the second comparison circuit 17 are 0, the first comparison circuit 15 and the second comparison circuit 17 output "L" level signals respectively to the gates of the third NMOS transistor 18 and the fourth NMOS transistor 19. This turns OFF both the third NMOS transistor 18 and the fourth NMOS transistor 19, so that the signal V1 from the control circuit 13 is applied to the gate of the first NMOS transistor 11, and the signal V2 from the control circuit 13 is applied to the gate of the second NMOS transistor 12.

Next, when the clock signal Vck is at the "H" level, both the fifth NMOS transistor 141 in the first temperature detection circuit 14 and the sixth NMOS transistor 161 of the second temperature detection circuit 16 are in the ON state, and thus the first thermistor 140 and the second thermistor 160 are fed with the currents. It is provided that the first thermistor 140 and the second thermistor 160 have such a characteristic that resistance values of the first thermistor 140 and the second thermistor 160 decrease as the temperature increases (negative resistance temperature coefficient). In this case, the voltage drops across the first thermistor 140 and the second thermistor 160 decrease as the temperature increases. That is, when the clock signal Vck is at the "H" level, detection voltages of the first comparison circuit 15 and the second comparison circuit 17 decrease as the temperature increases.

The first comparison circuit 15 compares the detection voltage with the reference voltage (for example, the amount of a voltage drop which is determined by a resistance value for the temperature of the first thermistor 140 corresponding to 100° C.) of the first reference voltage source 151. Then, the first comparison circuit 15 outputs a result of the comparison to the gate of the third NMOS transistor 18. The same holds for the second comparison circuit 17. When an output signal from the first comparison circuit 15 is at the "L" level, the third NMOS transistor 18 is in the OFF state, and thus the signal V1 is applied from the control circuit 13 to the gate of the first NMOS transistor 11. Compared to this, when the output signal from the first comparison circuit 15 is at the "H" level, the third NMOS transistor 18 is in the ON state, and thus the first NMOS transistor 11 is in the OFF state. That is, the protection device determines that the ambient temperature of the first NMOS transistor 11 exceeding 100° C., which is a predetermined value, is an abnormal state and shuts off the discharging current from the battery 10.

Likewise, when an output signal from the second comparison circuit 17 is at the "L" level, the fourth NMOS transistor 19 is in the OFF state, and thus the signal V2 is applied from the control circuit 13 to the gate of the second NMOS transistor 12. Compared to this, when the output signal from the second comparison circuit 17 is at the "H" level, the fourth NMOS transistor 19 is in the ON state, and thus the second NMOS transistor 12 is in the OFF state. That is, the protection device determines that the ambient temperature of the first NMOS transistor 11 exceeding 100° C., which is a predetermined value, is an abnormal state and shuts off the discharging current from the battery 10.

As described above, according to Embodiment 1, only during the ON time Ton of the clock signal Vck, the first temperature detection circuit 14 and the second temperature detection circuit 16 are fed with the currents, generating the detection voltages. The detection is not performed during times other than the ON time. However, even if the electric power consumption of the transistor abnormally increases for any cause, it takes a certain amount of time until the temperature increases to a critical level leading to a breakdown of the transistor. An OFF time in which the clock signal Vck is at the "L" level and the ON time Ton which is a detection time also depend on transient thermal resistance of the transistor whose temperature is to be detected. The OFF time can be set to between several milliseconds and several seconds, and several microseconds are sufficient for the ON time Ton. Therefore, compared to the conventional configuration in which a current is fed all the time, current consumption required for the detection can be reduced to Ton/Ts, that is, less than 1/1000.

Embodiment 2

Embodiment 2 according to the present invention will be described below with reference to the drawings.

In Embodiment 1 of FIG. 1, the description has been given of the protection device in which the first NMOS transistor 11 and the second NMOS transistor 12 connected to the negative electrode of the battery 10 and to a ground line connecting to the power source terminal 2 of the electronic apparatus 3 respectively shut off the discharging current and the charging current of the battery 10.

The protection device of the present invention is applicable to embodiments other than Embodiment 1. For example, in a protection device according to Embodiment 2 shown in FIG. 2A, a battery 10 and an electronic apparatus 3 share a ground line, and a first PMOS transistor 21 serially connected to a power source line shuts off a supply current from the battery 10 to the electronic apparatus 3.

Figure 2A:
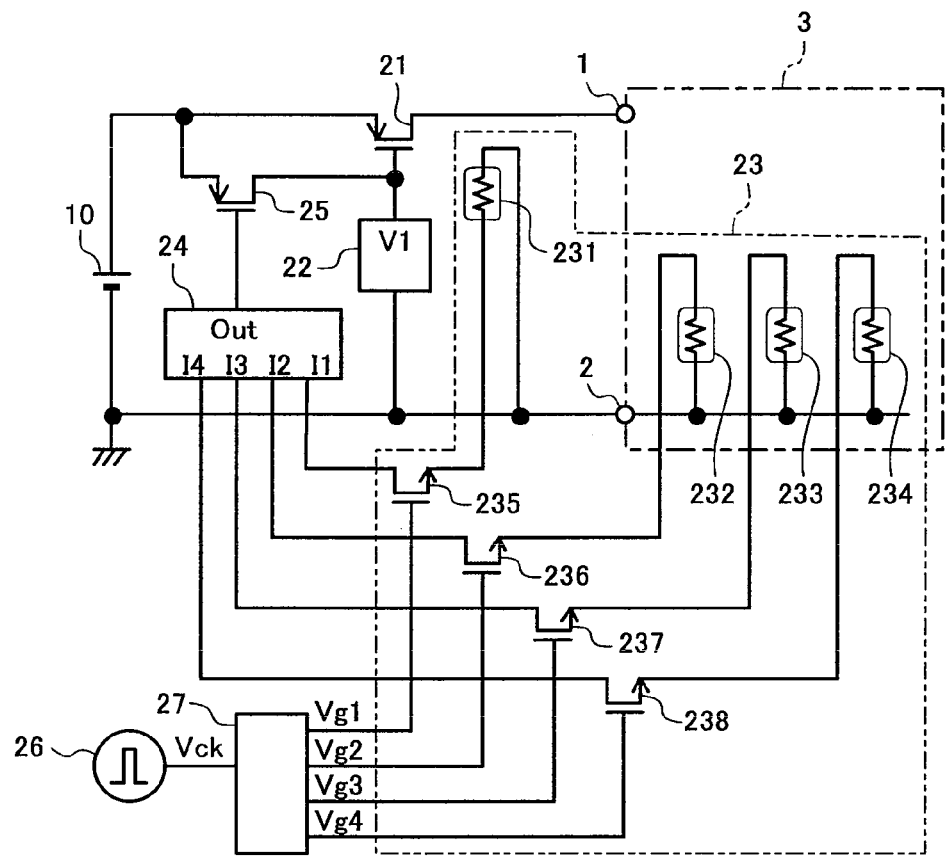
FIG. 2A is a circuit diagram illustrating a protection device according to Embodiment 2 of the present invention.

As shown in FIG. 2A, the protection device according to Embodiment 2 performs protection operation for the electronic apparatus 3 which has a first power source terminal 1 and a second power source terminal 2, wherein the first power source terminal 1 is connected to a positive electrode of the battery 10 serving as an external power source via the first PMOS transistor 21, and the second power source terminal 2 is connected to a grounded negative electrode of the battery 10.

The first PMOS transistor 21 controls supply of electric power from the battery 10 to the electronic apparatus 3. The gate of the first PMOS transistor 21 receives a signal V1 for controlling the first PMOS transistor 21 from a control circuit 22 connected to the negative electrode of the battery 10.

Figure 2B:
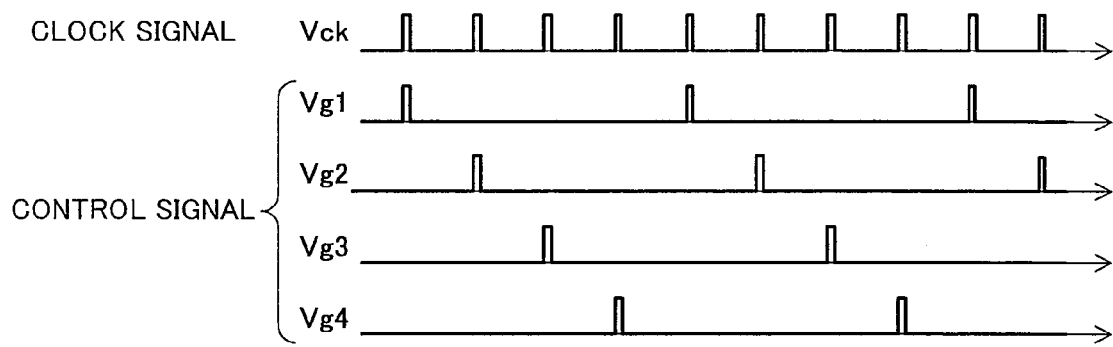
FIG. 2B is a timing chart illustrating a clock signal Vck and control signals Vg1 through Vg4 for driving the protection device according to Embodiment 2 of the present invention.

The protection device includes: a second PMOS transistor 25 connected between the gate and the source of the first PMOS transistor 21; a temperature detection circuit 23 having a first thermistor 231, a second thermistor 232, a second thermistor 233, and a fourth thermistor 234; a comparison circuit 24 for feeding a constant current to the temperature detection circuit 23 and comparing a voltage drop across each of the thermistors 231 through 234 with a reference voltage to turn ON/OFF the second PMOS transistor 25 depending on a result of the comparison; an oscillating circuit 26 for generating a clock signal Vck which is output therefrom, wherein the clock signal Vck repeatedly changes between high and low levels in a cycle Ts; and a divider circuit 27 serving as a protection control circuit, wherein the divider circuit 27 divides the clock signal Vek at least by 4 to produce control signals Vg1 through Vg4 which are output to the temperature detection circuit 23. Here, a period when the clock signal Vck is at the "H" level is understood to be an ON time Ton. FIG. 2B shows a timing diagram of the clock signal Vck and the control signals Vg1 through Vg4.

Specifically, the temperature detection circuit 23 includes a first thermistor 231 one terminal of which is grounded, a second thermistor 232 one terminal of which is grounded, a third thermistor 233 one terminal of which is grounded, a fourth thermistor 234 one terminal of which is grounded, a first NMOS transistor 235, a second NMOS transistor 236, a third NMOS transistor 237, and a fourth NMOS transistor 238. The first NMOS transistor 235 has the source connected to the other terminal of the first thermistor 231, the gate for receiving the control signal Vg1, and the drain for receiving the constant current from the comparison circuit 24. The second NMOS transistor 236 has the source connected to the other terminal of the second thermistor 232, the gate for receiving the control signal Vg2, and the drain for receiving the constant current from the comparison circuit 24. The third NMOS transistor 237 has the source connected to the other terminal of the third thermistor 233, the gate for receiving the control signal Vg3, and the drain for receiving the constant current from the comparison circuit 24. The fourth NMOS transistor 238 has the source connected to the other terminal of the fourth thermistor 234, the gate for receiving the control signal Vg4, and the drain for receiving the constant current from the comparison circuit 24. Here, for example, the first thermistor 231 is arranged near the first PMOS transistor 11 in order to detect an ambient temperature of the first PMOS transistor 21, and the second through fourth thermistors 232-234 are respectively provided in predetermined monitoring places in the electronic apparatus 3.

Figure 3:
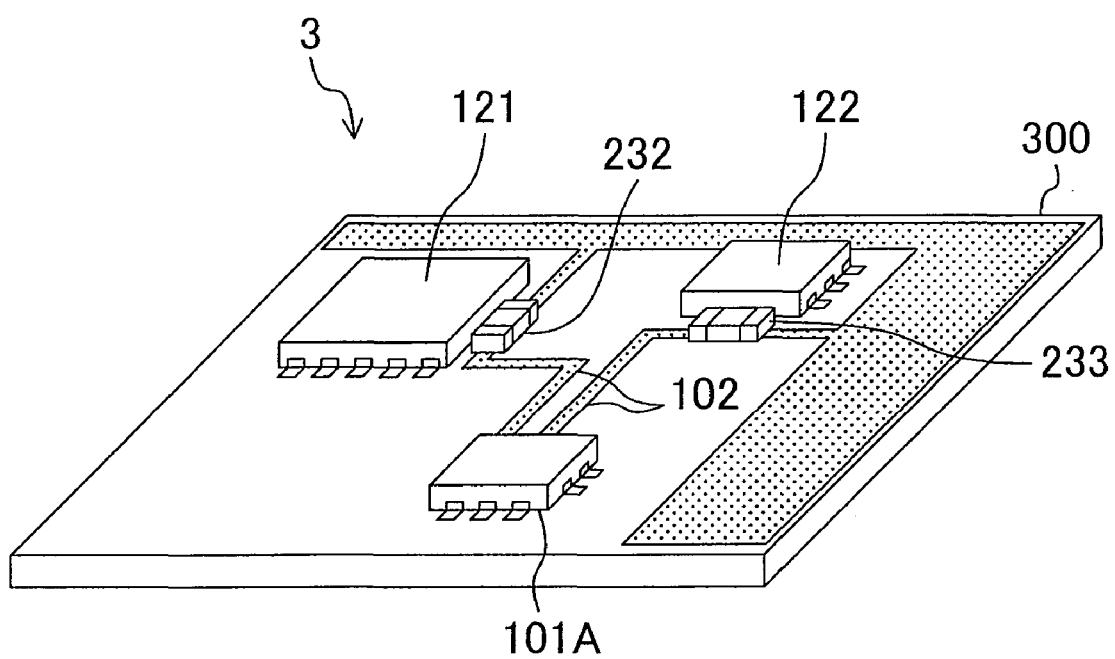
FIG. 3 is a perspective view illustrating a mounting example of the protection device according to Embodiment 2 of the present invention.

In FIG. 3, as an example, an arrangement of the second thermistor 232 and the third thermistor 233 and a mounting state of a protection device 101A are shown. In this case, the comparison circuit 24, the oscillating circuit 26, the divider circuit 27, and NMOS transistors 235 through 238 of the temperature detection circuit 23 are integrated (on one chip) in the protection device 101A. As shown in FIG. 3, a first IC chip 121 and a second IC chip 122 which are to be monitored and the protection device 101A are mounted on a mounting substrate 300. The first IC chip 121 and the second IC chip 122 constitute the electronic apparatus 3. The protection device 101A protects the first IC chip 121 and the second IC chip 122 from overheating. For example, the second thermistor 232 is arranged near a side surface of the first IC chip 121, and the third thermistor 233 is arranged near a side surface of the second IC chip 122. Here, the protection device 101A is electrically connected to the thermistors 232 and 233 via wiring 102. It is to be noted that the first PMOS transistor 21 can be integrated in the protection device 101A.

Although not shown, the comparison circuit 24 has four components each of which includes the same comparator 150, reference voltage source 151, and constant current source 152 as those of the first comparison circuit 15 of FIG. 1 and outputs a negated logical sum (NOR) of output signals from the comparators. The comparison circuit 24 has a first detection terminal I1, a second detection terminal I2, a third detection terminal I3, a fourth detection terminal I4, and an output terminal Out. From the first detection terminal I1, the constant current is fed to the first thermistor 231 via the first NMOS transistor 235 in the temperature detection circuit 23, and the voltage drop across the first thermistor 231 is detected and compared with the reference voltage. Likewise, from the second through fourth detection terminals I2-I4, the constant current is fed to the second through fourth thermistors 232-234 via the second through fourth NMOS transistors 236-238 respectively, and the voltage drop across each of the thermistors 232 through 234 is detected and compared with the reference voltage.

Operation of the protection device having the above-mentioned configuration according to Embodiment 2 of the present invention will be described below.

First, when the clock signal Vck is at the "L" level, the first through fourth NMOS transistors 235-238 in the temperature detection circuit 23 are in the OFF state, and thus the first through second thermistors 231-234 are not fed with a current. Therefore, a detection current of the comparison circuit 24 is 0, and thus a signal at a "H" level is output to the gate of the second PMOS transistor 25. This turns OFF the second PMOS transistor 25, allowing the signal V1 from the control circuit 22 to be applied to the gate of the first PMOS transistor 21.

Next, when the clock signal Vck is at the "H" level, one of the control signals Vg1 through Vg4 is at a "H" level due to the divider circuit 27. For example, when the control signal Vg1 is at the "H" level, the first NMOS transistor 235 is in the ON state, and thus the first thermistor 231 is fed with the current. It is provided that the first thermistor 231 has such a characteristic that the resistance value of the first thermistor 231 decreases as the temperature increases. In this case, the voltage drop across the first thermistor 231 decreases as the temperature increases. That is, when the control signal Vg1 is at the "H" level, a voltage of the first detection terminal I1 of the comparison circuit 24 decreases as the temperature increases. The comparison circuit 24 compares the voltage of the first detection terminal I1 with the reference voltage (for example, the amount of a voltage drop determined by a resistance value for the temperature of the first thermistor 231 corresponding to 100° C.). Then, the comparison circuit 24 outputs a result of the comparison from the output terminal Out to the gate of the second PMOS transistor 25. When the output terminal Out of the comparison circuit 24 is at a "H" level, the second PMOS transistor 25 is in the OFF state, so that the signal V1 is applied to the gate of the first PMOS transistor 21 from the control circuit 22. Compared to this, when the output terminal Out of the comparison circuit 24 is at a "L" level, the second PMOS transistor 25 is in the ON state, and thus the first PMOS transistor 21 is in the OFF state. That is, the protection device determines that the ambient temperature of the first PMOS transistor 21 exceeding 100° C., which is a predetermined value, is an abnormal state and shuts off the supply current from the battery 10 to the electronic apparatus 3.

Likewise, when the control signal Vg2 is at the "H" level, the second NMOS transistor 236 in the temperature detection circuit 23 is in the ON state, and thus the second thermistor 232 is fed with a current. It is provided that the second thermistor 232 has such a characteristic that the resistance value of the second thermistor 232 decreases as the temperature increases. In this case, the voltage drop across the second thermistor 232 decreases as the temperature increases. That is, when the control signal Vg2 is at the "H" level, a voltage of the second detection terminal I2 of the comparison circuit 24 decreases as the temperature increases. The comparison circuit 24 compares the voltage of the second detection terminal I2 with the reference voltage (for example, the amount of a voltage drop determined by a resistance value for the temperature of the second thermistor 232 corresponding to 100° C.). Then, the comparison circuit 24 outputs a result of the comparison from the output terminal Out to the gate of the second PMOS transistor 25. That is, the protection device determines that the temperature of the second thermistor 232 arranged in a predetermined monitoring place in the electronic apparatus 3 exceeding a predetermined value is an abnormal state and shuts off the supply current from the battery 10 to the electronic apparatus 3.

When the control signal Vg3 or the Vg4 is at the "H" level, the same operation as mentioned above is sequentially performed. The protection device determines that the temperature of the third thermistor 233 or the fourth thermistor 234 arranged in other monitoring place in the electronic apparatus 3 exceeding a predetermined value is an abnormal sate and shuts off the supply current from the battery 10 to the electronic apparatus 3.

As described above, according to Embodiment 2, the detection terminals I1 through I4 for the temperature detection circuit 23 and for the comparison circuit 24 are fed with the current only during the ON time Ton in which the control signals Vg1 through Vg4 obtained by dividing the clock signal Vck are respectively at the "H" level. The detection is not performed during times other than the ON time. However, it takes a certain amount of time until electric power consumption in each monitoring place abnormally increases and the temperature increases to a critical level leading to a breakdown. Therefore, compared to the case where the detection current is fed all the time, the consumption current required for the detection can be reduced to Ton/(4 Ts). Of course, the number of places for monitoring the temperature is not limited to four. Less than or more than four monitoring places are possible.

According to the protection device according to Embodiment 2, a plurality of temperature detection means (thermistors) sequentially perform detection operation in a time division manner, so that the detection current is distributed not to concentrate in a certain time. Therefore, noise occurring in a detection operation state is reduced and improper operation is prevented. Moreover, specifying a detection place of an abnormal state is also facilitated.

Embodiment 3

Embodiment 3 according to the present invention will be described below with reference to the drawings.

Figure 4:
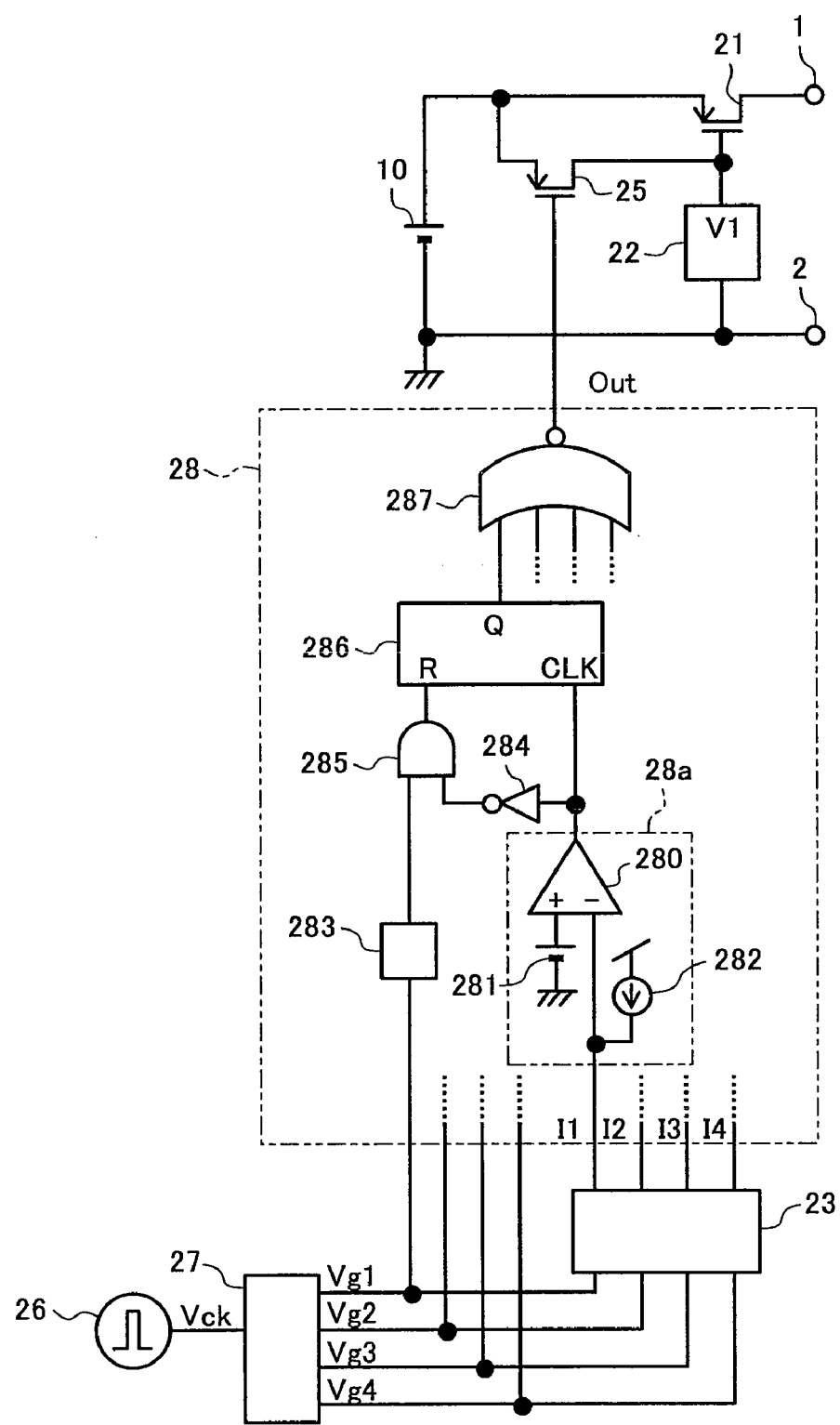
FIG. 4 is a circuit diagram illustrating a protection device according to Embodiment 3 of the present invention.

FIG. 4 shows a circuit configuration of a protection device according to Embodiment 3 of the present invention. In FIG. 4, the same components as those of FIG. 2 are given the same reference numerals and descriptions thereof are omitted.

The protection device according to Embodiment 3 is different from the protection device according to Embodiment 2 in that a judging circuit 28 is provided. It is to be noted that, in FIG. 4, detailed configurations of the electronic apparatus 3 and the temperature detection circuit 23 are the same as those of Embodiment 2, and thus descriptions thereof are omitted.

As shown in FIG. 4, an output signal from the temperature detection circuit 23 detected during the ON time of a control signal Vg1 of a divider circuit 27 is coupled to a first detection terminal I1 of the judging circuit 28, and an output signal from the temperature detection circuit 23 detected during the ON time of a control signal Vg2 is coupled to a second detection terminal I2 of the judging circuit 28. Likewise, an output signal from the temperature detection circuit 23 detected due to a control signal Vg3 is coupled to a third detection terminal I3 of the judging circuit 28, and an output signal from the temperature detection circuit 23 detected due to a control signal Vg is coupled to a fourth detection terminal I4 of the judging circuit 28.

The judging circuit 28 includes: a first comparison circuit 28a connected to the first detection terminal I1; a delay circuit 283 for delaying the control signal Vg1 for a predetermined time which is output therefrom; an AND circuit 285 one input terminal of which receives the delayed signal from the delay circuit and the other input terminal of which receives an output signal from the comparison circuit 28a via an inverter 284; a counter circuit 286 having a clock input terminal CLK for receiving the output signal from the comparison circuit 28a, and a reset terminal R for receiving an output signal from the AND circuit 285; and a NOR circuit 287 one input terminal of which is connected to an output terminal Q of the counter circuit 286, and an output terminal Out of which is connected to the gate of the second PMOS transistor 25.

The first comparison circuit 28a includes a comparator 280 which has a positive phase terminal for receiving a reference voltage from a reference voltage source 281 and a negative phase terminal connected to a constant current source 282 and to the first detection terminal I1. The comparator 280 compares a detection voltage which is input from the temperature detection circuit 23 to the first detection terminal I1 with the reference voltage from the reference voltage source 281. Meanwhile, the constant current source 282 feeds a predetermined current to the temperature detection circuit 23 via the first detection terminal I1. As described above, the comparator 280, the reference voltage source 281, and the constant current source 282 have the same configurations as those of the comparison circuit of FIG. 1. Although not shown, the second through fourth detection terminals I2-I4 are provided with the same comparison circuits 28a.

When a "H" level is input to the reset terminal R of the counter circuit 286, the counter circuit 286 resets a count number to 0, and counts a signal at a "H" level input to the clock input terminal CLK. When the count number reaches a predetermined value, an output signal at a "H" level is output from the output terminal Q.

A delay circuit 283, an inverter 284, an AND circuits 285, and the NOR circuit are also provided for each of the control signals Vg2 through Vg4.

Operation of the protection device having the above-mentioned configuration according to Embodiment 3 of the present invention will be described below. Here, in synchronization with the respective control signals Vg1 through Vg4 obtained by dividing the clock signal Vck, detection signals in respective monitoring places in the electronic apparatus (not shown) are output from the temperature detection circuit 23. The output detection signals are output to the first comparison circuit 28a and the other comparison circuits respectively connected to the first through fourth detection terminals I1-I4, and compared with the reference voltage in the comparison circuit 28a and the other comparison circuits. This configuration is the same as that in Embodiment 2.

Here, with reference to the control signal Vg1 and the detection signal input to the first detection terminal I1, operation of the delay circuit 283, the inverter 284, the AND circuit 285, the counter circuit 286, and the NOR circuit 287 will be described.

A delay time of the delay circuit 283 is set to be longer than or equal to a duration from a rise of the control signal Vg1 until the inverter 284 outputs an inversion signal of an output signal of the comparator 280. Here, a reason why the delay circuit 283 is provided between the divider circuit 27 and a terminal of the AND circuit 285 for receiving the control signal Vg1 is as follows. If the delay circuit 283 were not provided in the case where the comparator 280 detects abnormality from the detection signal input to the first detection terminal I1 and changes its output signal from a "L" level to a "H" level, an output of the inverter 284 would become "H" level at the rise of the control signal Vg1, resetting the counter circuit 286 in every cycle. Moreover, the delay circuit 283 transmits the control signal Vg1 with only the rise of the control signal Vg1 being delayed but a fall of the control signal Vg1 not being delayed. Therefore, the case where the AND circuit 285 outputs a "H" level means that the output signal of the comparator 280 becomes the "L" level within the ON time of the control signal Vg1. This is normal operation in which no abnormality is detected.

Next, once the comparator 280 detects abnormality from the detection signal input to the first detection terminal I1 and changes its output signal from the "L" level to the "H" level, the rise of the output signal of the delay circuit 283 is ignored in the AND circuit 285. The counter circuit 286 counts the output signal at the "H" level of the comparator 280. If this abnormality detection is any improper operation, the output signal from the comparator 280 eventually becomes "L" level. As a result, an output signal from the AND circuit 285 becomes "H" level at the rise of the output signal from the delay circuit 283, which resets a count value of the counter circuit 286. However, if the abnormal state lasts, the counter circuit 286 continues counting up, and when the count value reaches a predetermined value, the counter circuit 286 outputs the "H" level to the output terminal Q. That is, if an abnormality detection signal output in synchronization with the control signal Vg1 is repeatedly generated for a predetermined number of times, the counter circuit 286 outputs the "H" level. Therefore, an output of the NOR circuit 287 becomes "L" level, so that the second PMOS transistor 25 is turned ON. Therefore, the first PMOS transistor 21 is short-circuited between the gate and the source, so that the first PMOS transistor 21 is turned OFF. As a result, the supply current from the battery 10 to the electronic apparatus is shut off. It is to be noted that the same operation holds for the abnormality detection in the other monitoring places.

As described above, according to Embodiment 3, an abnormal state is recognized and the protection operation is performed only when the abnormality detection signal is repeatedly generated for a predetermined number of times, so that it is possible to prevent the improper operation of the protection device caused by extraneous noise or the like.

Embodiment 4

Embodiment 4 according to the present invention will be described below with reference to the drawings.

Figure 5:
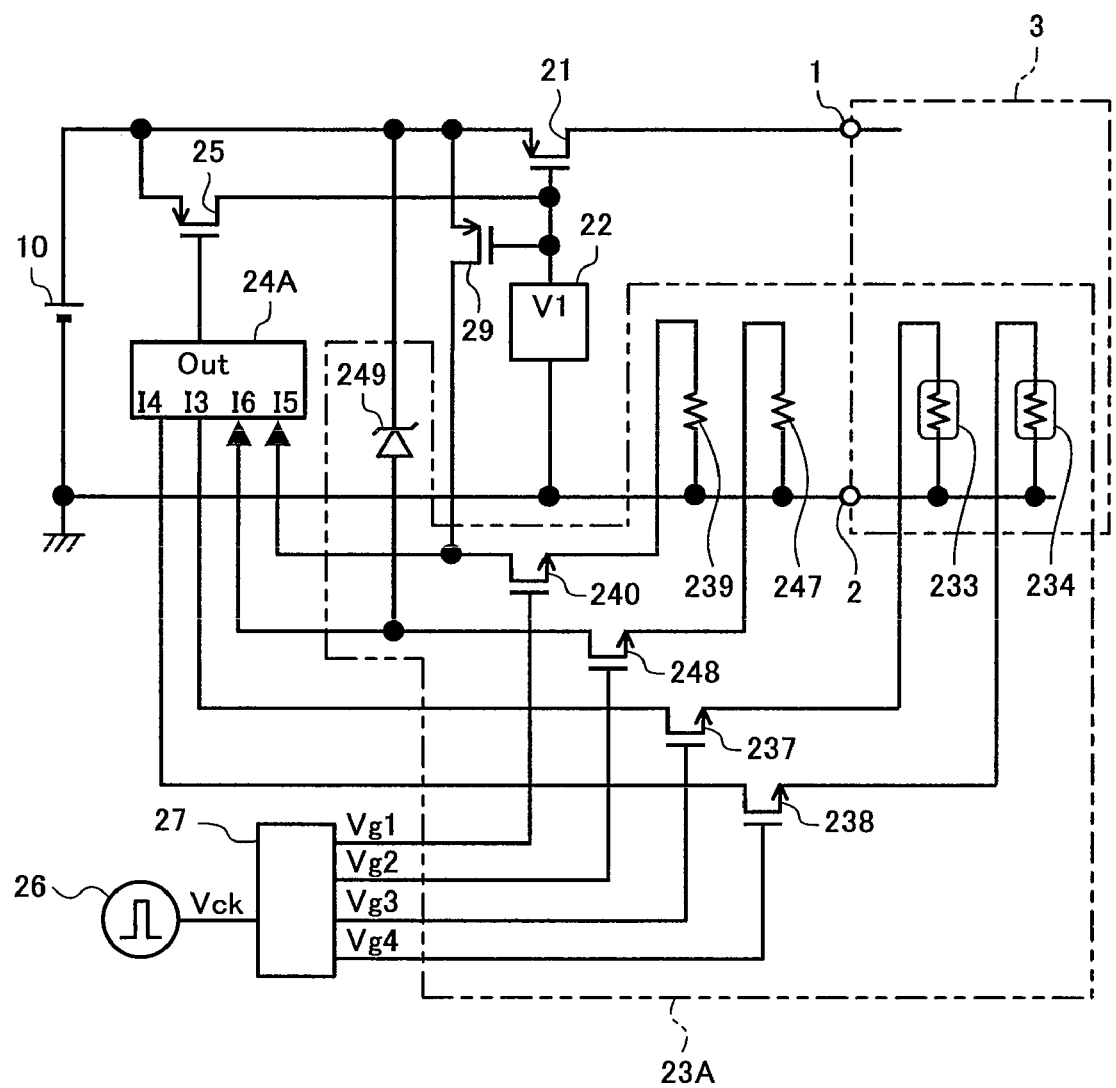
FIG. 5 is a circuit diagram illustrating a protection device according to Embodiment 4 of the present invention.

FIG. 5 shows a circuit configuration of a protection device according to Embodiment 4 of the present invention. In FIG. 5, the same components as those of FIG. 2 are given the same reference numerals and descriptions thereof are omitted.

As shown in FIG. 5, the protection device according to Embodiment 4 is different from the protection device according to Embodiment 2 in that the protection device of Embodiment 4 includes a current detection circuit 29 forming a current mirror with the first PMOS transistor 21, and further, a detection circuit 23A includes a first detection resistor 239 as an alternative to the first thermistor 231 for temperature detection of the first PMOS transistor 21, wherein an output current of the current detection circuit 29 is fed to the first detection resistor 239 via a first NMOS transistor 240 so that the amount of a voltage drop across the first detection resistor 239 is detected at a first detection terminal I5 of a comparison circuit 24A. Another difference is that as an alternative to the second thermistor 232 for temperature detection, a second detection resistor 247 is provided, and an output current of a Zener diode 249, which is a voltage detection circuit, is fed to the second detection resistor 247 via a second NMOS transistor 248 so that the amount of a voltage drop across the second detection resistor 247 is detected at a second detection terminal I6 of the comparison circuit 24A.

Operation of the protection device having the above-mentioned configuration according to Embodiment 4 of the present invention will be described below. Specifically, descriptions are given of operation with respect to current detection and operation with respect to voltage detection which are different from those of Embodiment 2.

First, the operation with respect to the current detection will be described.

The protection device detects a current flowing through the first PMOS transistor 21 by the current detection circuit 29. When the control signal Vg1 is at a "H" level, the comparison circuit 24A compares the detection value of the first detection terminal I5 with the reference voltage and then outputs a result of the comparison from the output terminal Out. Although details are not shown, the comparison circuit 24A is configured such that when the amount of current flowing through the first detection resistor 239 increases and the detection value of the first detection terminal I5 of the comparison circuit 24A exceeds the reference voltage, the comparison circuit 24A causes the output terminal Out to transition to a "L" level. Therefore, when the output terminal Out of the comparison circuit 24A is at a "H" level, a signal V1 of a normal state is applied to the gate of the first PMOS transistor 21. Meanwhile, when output terminal Out of the comparison circuit 24A is at the "L" level, the first PMOS transistor 21 is in the OFF state. That is, the protection device determines that the current of the first PMOS transistor 21 exceeding a predetermined value is an abnormal state and shuts off supply current from the battery 10 to electronic apparatus 3.

Next, the operation with respect to the voltage detection will be described.

In the protection device according to Embodiment 4, the Zener diode 249 and the second detection resistor 247 are serially connected to both terminals of the battery 10 via the second NMOS transistor 248. It is provided that the voltage of the battery 10 is denoted by Vb and the Zener voltage of the Zener diode 249 is denoted by Vz. In this case, when the second NMOS transistor 248 is in the ON state, a voltage of (Vb-Vz) is generated across the second detection resistor 247, and the generated voltage (Vb-Vz) is applied to the second detection terminal I6 of the comparison circuit 24A. The comparison circuit 24A is configured such that when the detection value of the second detection terminal I6 exceeds the reference voltage as in the case of the first detection terminal I5, the comparison circuit 24A causes the output terminal Out to transition to the "L" level. Therefore, when the output terminal Out of the comparison circuit 24A is at the "L" level, the first PMOS transistor 21 is in the OFF state. That is, the protection device determines that the voltage Vb of the battery 10 exceeding a predetermined value is a false connection to an irregular battery or an abnormal state such as overcharging and shuts off the supply current from the battery 10 to the electronic apparatus 3.

As described above, the protection device of the present invention is not limited to temperature detection of the electronic apparatus 3, and is applicable to protection operation through the current detection or the voltage detection. Moreover, the protection device of the present invention can adopt the improper detection preventing function in which the protection operation is performed after the abnormal state is repeatedly detected for a predetermined number of times as in Embodiment 3.

Embodiment 5

Embodiment 5 according to the present invention will be described below with reference to the drawings.

Figure 6:
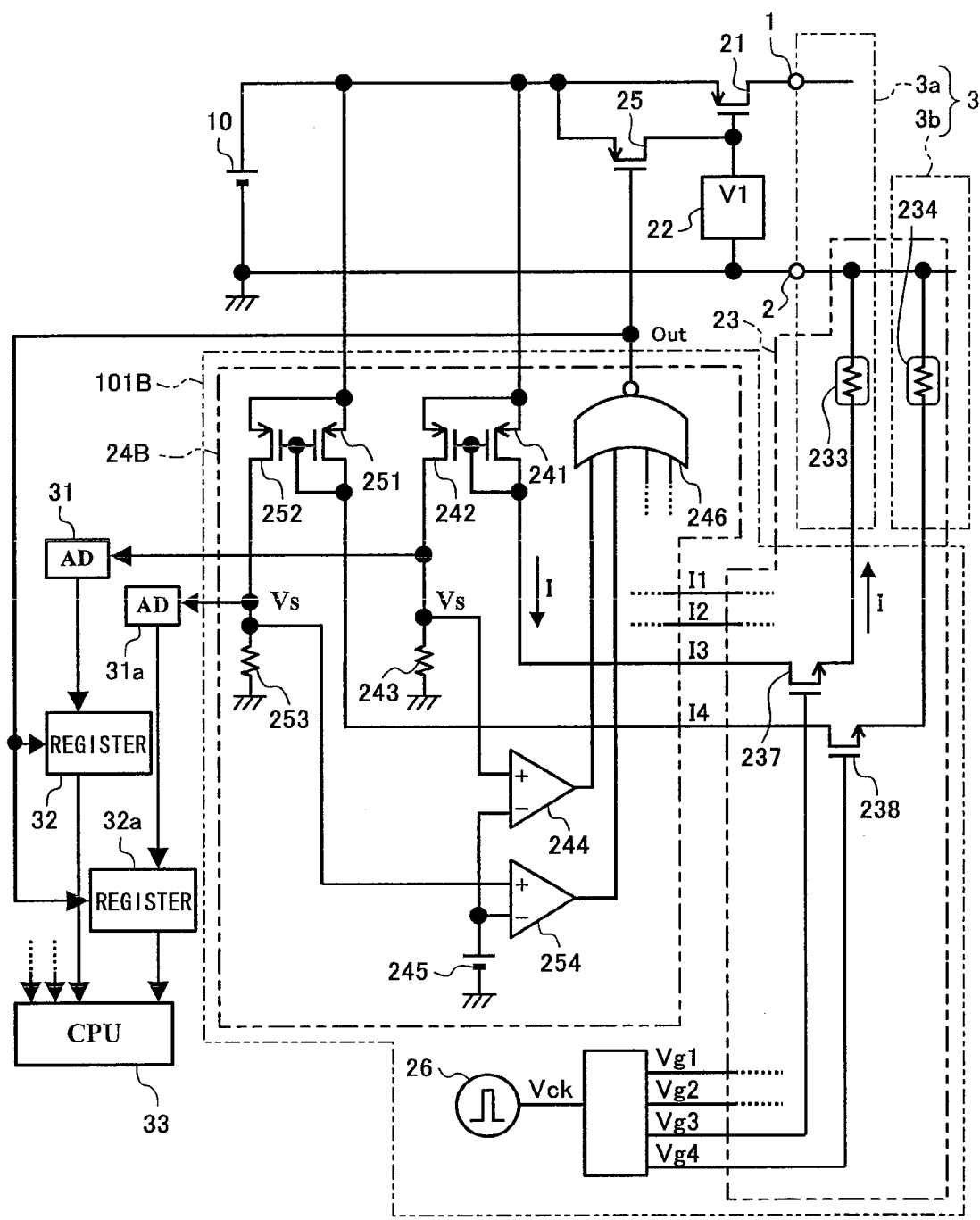
FIG. 6 is a circuit diagram illustrating a protection device according to Embodiment 5 of the present invention.

FIG. 6 shows a circuit configuration of a protection device according to Embodiment 5 of the present invention. In FIG. 6, the same components as those of FIG. 2 are given the same reference numerals and descriptions thereof are omitted.

As shown in FIG. 6, the protection device according to Embodiment 5 is different from the protection device according to Embodiment 2 in configuration of a comparison circuit 24B, and in that AD (analog-to-digital) converters 31 and 31a, registers 32 and 32a, and a central processing unit (CPU) 33 are provided. It is to be noted that, in FIG. 6, the electronic apparatus 3 is divided into a first electronic apparatus 3a and a second electronic apparatus 3b. Moreover, components identified by a reference number 101B are components which can be integrated in the protection device of the present embodiment as an integrated circuit. Although not shown, the CPU 33 is connected to a detachable power source.

The comparison circuit 24B according to Embodiment 5 includes: a third PMOS transistor 241 and a fourth PMOS transistor 242 forming a current mirror; a first resistor 243 one terminal of which is connected to the drain of the fourth PMOS transistor 242 and the other terminal of which is grounded; a first comparator 244 having a negative phase terminal connected to a reference voltage source 245 and a positive phase terminal connected to the one terminal of the first resistor 243; and a NOR circuit 246 one input terminal of which is connected to an output terminal of the first comparator 244 and an output terminal Out of which is connected to the gate of the second PMOS transistor 25. Likewise, the comparison circuit 24B includes a fifth PMOS transistor 251 and a sixth PMOS transistor 252 forming a current mirror, a second resistor 253 connected to the sixth PMOS transistor 252, and a second comparator 254.

The third PMOS transistor 241 feeds a current from a third detection terminal I3 of the comparison circuit 24B via the third NMOS transistor 237 of the temperature detection circuit 23 to the third thermistor 233. At this point, a current output from the fourth PMOS transistor 242 flows to the first resistor 243, generating a voltage Vs across the first resistor 243, and the voltage Vs serving as a detection value is compared with a reference voltage of the reference voltage source 245 by the first comparator 244.

In a manner similar to this, the fifth PMOS transistor 251 feeds a current from a fourth detection terminal I4 of the comparison circuit 24B via the fourth NMOS transistor 238 of the temperature detection circuit 23 to the fourth thermistor 234. At this point, a current output from the sixth PMOS transistor 252 flows to the second resistor 253, generating a voltage Vs across the second resistor 253, and the voltage Vs serving as a detection value is compared with the reference voltage of the reference voltage source 245 by the second comparator 253.

Although not shown, the comparison circuit 24B has a configuration in which like current mirrors and like comparators form pairs for the other NMOS transistors and the other thermistors of the temperature detection circuit 23. Output signals from the other comparators are respectively input to the other input terminals of the NOR circuit 246.

In Embodiment 5, the AD converters 31 and 31a receive the detection voltages Vs respectively generated across the resistors 243 and 253. The registers 32 and 32a receive output signals respectively from the AD converters 31 and 31a, and an output signal from an output terminal Out of the NOR circuit 246. The CPU 33 receives output signals at least from the registers 32 and 32a.

Specifically, the voltage values of the detection voltages Vs respectively detected by the resistors 243 and 253 are converted to digital data by the AD converters 31 and 31a and output respectively to the registers 32 and 32a. A signal of the output terminal Out of the comparison circuit 24B is input as a capture signal to each of the registers 32 and 32a. The CPU 33 reads the data from the registers 32 and 32a. Although not shown, the other detection voltage values of the comparison circuit 24B are converted in the same manner to digital data by the AD converter 31, and sent to registers (not shown) and read by the CPU 33.

Operation of the protection device having the above-mentioned configuration according to Embodiment 5 of the present invention will be described below. Here, in synchronization with control signals Vg1 through Vg4 obtained by dividing a clock signal Vck, detection signals in respective monitoring places in the electronic apparatus (not shown) are input from the temperature detection circuit 23 to the comparison circuit 24B connected thereto. This configuration is the same as that of Embodiment 2.

Here, referring to the control signal Vg3 and a signal of the third detection terminal I3, operation of the comparison circuit 24B will be described.

The third PMOS transistor 241 has the gate and the drain short-circuited to be connected to the drain of the third NMOS transistor 237. It is provided that a "H" level of the control signal Vg3 input to the gate of the third NMOS transistor 237 is a constant voltage. In this case, provided that a resistance value of the third thermistor 233 is R3, the current I fed to the third thermistor 233 is represented by the following expression (1).

$$I=(Vg3-Vt)/R3 \tag{1}$$

Here, Vt is the threshold voltage between the gate and the source of the third NMOS transistor 237. The current I represented by the expression (1) flows through the third PMOS transistor 241, and a current depending on the mirror ratio also flows to the fourth PMOS transistor 242 forming the current mirror with the third PMOS transistor 241. For example, provided that the mirror ratio is 1 and the resistance value of the first resistor 243 is Rs, the detection voltage Vs is represented by the following expression (2).

$$Vs=Rs \times I=Rs(Vg3-Vt)/R3 \tag{2}$$

That is, when the resistance value R3 decreases as the temperature of the third thermistor 233 increases, the detection voltage Vs increases. The first comparator 244 compares the detection voltage Vs with the reference voltage (for example, the amount of a voltage drop determined by a resistance value for the temperature of the thermistor corresponding to 100° C.), and outputs a result of the comparison from the output terminal Out. As described above, the comparison circuit 24B is not limited to the configuration of Embodiment 2 and capable of setting of the relationship between the temperature and the detection voltage Vs in consideration of characteristics of the thermistor.

Moreover, the detection voltage Vs is converted by the AD converter 31 to digital data which is output to the register 32. As described above, the output signal from the output terminal Out of the comparison circuit 24B is input as the capture signal to the register 32. According to the capture signal, the CPU 33 reads the data from the register 32. Therefore, when abnormality is detected in any of the monitoring places and thus the output voltage from the output terminal Out of the comparison circuit 24B becomes "L" level, the CPU 33 reads the data, for example, from the register 32. In this way, internal temperatures in a plurality of places at the time of abnormality detection in the electronic apparatus are recorded, which is useful for an analysis of operation in an abnormal state.

Although not shown, a configuration may be possible in which as an alternative to the output signal from the output terminal Out of the comparison circuit 24B, the control signal Vg3 to the third NMOS transistor 237 is used as the capture signal of the register 32. In this configuration, also for the detection voltages in the other monitoring places, detection data is captured in the register 32a and the like using the control signals Vg1, Vg2, and Vg4, and then read in the CPU 33. In such a configuration, the detection data in the monitoring places in the electronic apparatus is continuously read in the CPU 33. Therefore, for example, recording the maximum value of the detection data in the CPU 33 while updating makes it possible to analyze an operational environment of the electronic apparatus 3 regardless of whether abnormality is detected or not. Especially as to a mobile apparatus, even if a level which is regarded as a high temperature is not reached, there may be a case where occurrence of an abnormal state notified by a user using the mobile apparatus for many hours is required to be dealt with. In such a case, if the highest temperature in each place in the electronic apparatus is recorded, the recorded temperature can be used for an analysis.

Moreover, capturing operation of the capture signals of the register 32 and the other registers may be performed by the CPU 33 according to need. In this case, it is clear that electric power consumption can be reduced compared to the case of continuous data capturing by using the above-mentioned control signals Vg1 through Vg4 as the capture signal of the detection data.

As described above, according to Embodiment 5, since the detection signals which are respectively synchronous with the control signals Vg1 through Vg4 obtained by dividing the clock signal Vck are generated, the protection device also has a feature that the detection value is easily subjected to analog-digital conversion and then processed. Therefore, a defect place of the electronic apparatus where abnormality occurs can be checked without breaking the electronic apparatus 3.

It is to be note that the improper detection can be prevented by configuring the protection device as Embodiment 3 where the protection operation is performed when abnormality is repeatedly detected for a predetermined number of times.

Variation 1 of Embodiment 5

Figure 7:
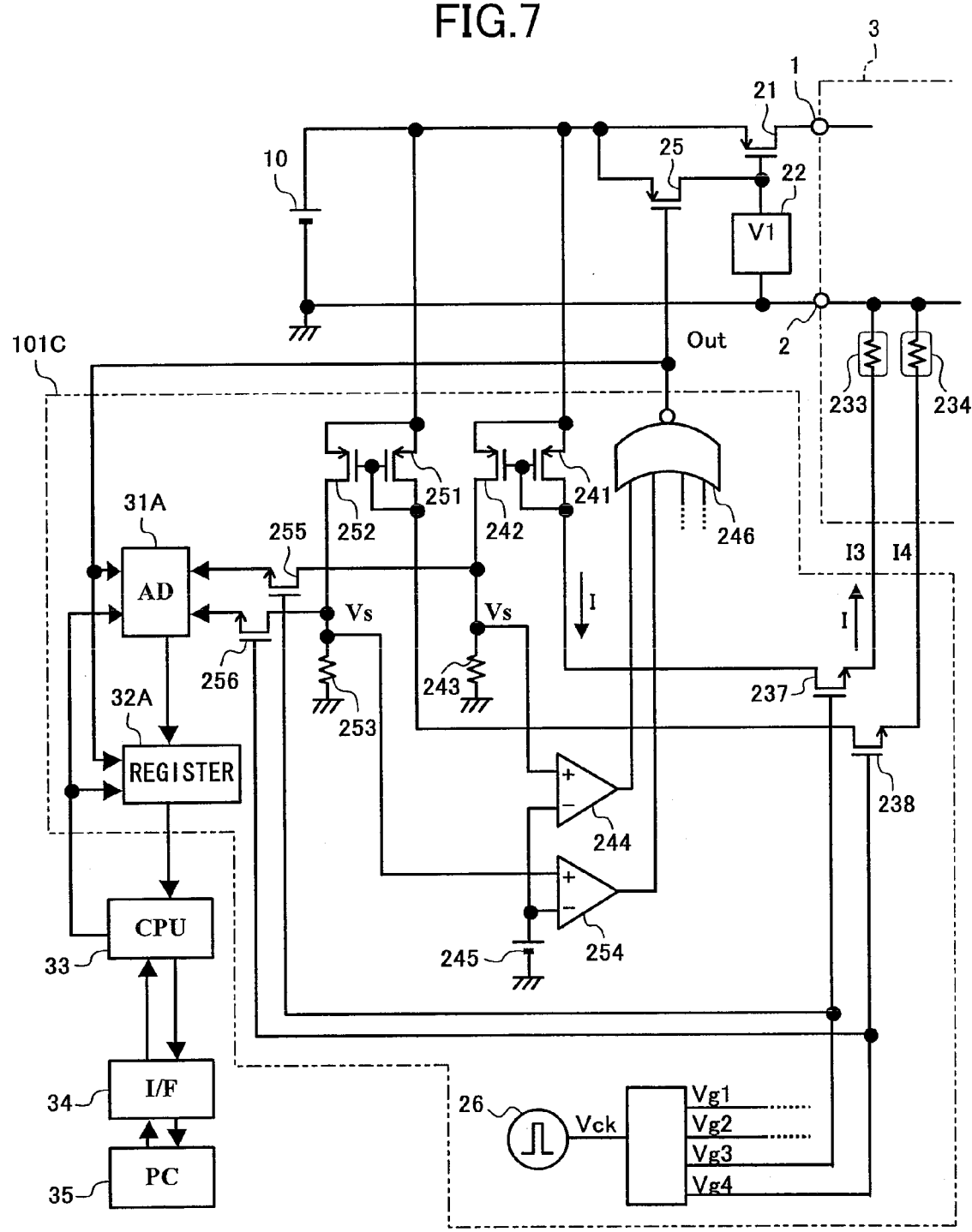
FIG. 7 is a circuit diagram illustrating a protection device according to Variation 1 of Embodiment 5 of the present invention.

FIG. 7 shows a circuit configuration of a protection device according to Variation 1 of Embodiment 5. As shown in FIG. 7, the protection device according to Variation 1 has such a configuration that an AD converter 31b and a register 32b are provided in an integrated circuit 101C including main components of the protection device. In the present variation, the AD converters 31 and 31a of FIG. 6 are represented by an AD converter 31A, and the registers 32 and 32a are represented by a register 32A.

In the present variation, the CPU 33 connected to the protection device allows operation of the AD converter 31A at arbitrary timing or at a stop of operation of the electronic apparatus due to occurrence of abnormality, and captures detection data recorded in the register 32A. The detection data captured in the CPU 33 is captured in a personal computer (PC) 35 via an interface device 34 such as a connector and then analyzed.

In this way, it is possible to downsize the protection device by integrating a plurality of AD converters and a plurality of registers in the protection device itself. Moreover, the integration of a register in which an occurrence history of the detected abnormal state can be stored according to a command from an external PC makes it possible to enhance a recording function.

Variation 2 of Embodiment 5

Figure 8:
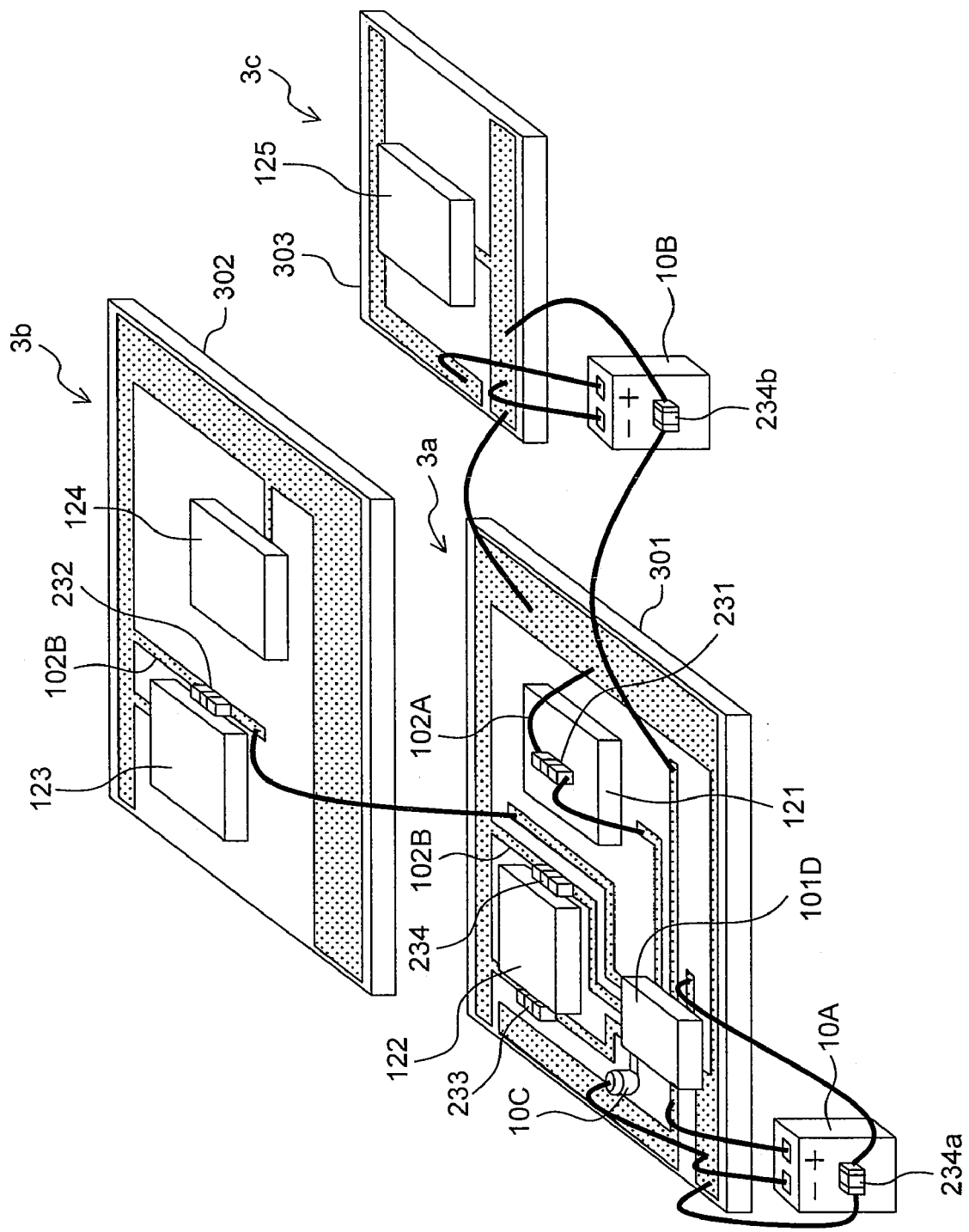
FIG. 8 is a perspective view illustrating a mounting example of the protection device according to Embodiment 5 of the present invention.

FIG. 8 shows Variation 2 of Embodiment 5 of the present invention illustrating a mounting example of a protection device on an electronic apparatus. As shown in FIG. 8, in Variation 2, a first IC chip 121, a second IC chip 122, and a protection device 101D are mounted on a first mounting substrate 301. The first IC chip 121 and the second IC chip 122 constitute the electronic apparatus 3a. In the protection device 101D, main components of the present invention are integrated. On a second mounting substrate 302, a third IC chip 123 and a fourth IC chip 124 which constitute the electronic apparatus 3b are mounted. On a third mounting substrate 303, a fifth IC chip 125 which constitutes an electronic apparatus 3c is mounted.

The first mounting substrate 301 and the second mounting substrate 302 are supplied with a power source voltage by a first battery 10A. The third mounting substrate 303 is supplied with a power source voltage by a second battery 10B. Moreover, on the first mounting substrate 301, a third battery 10C is arranged as a back-up power source for the detection data held in a protection device 101D.

Embodiments and Variations thereof described above refer to the configuration in which the battery 10 serves as an input power source of the protection device according to the present invention. In the present variation, not only temperature detection of the first battery 10A itself which serves as a power source for the integrated protection device 101D, but also temperature detection of the second battery 10B which is independent of the protection device 101D are possible.

As shown in FIG. 8, as an example, a first thermistor 231 for temperature detection is directly arranged on an upper surface of the first IC chip 121 mounted on the first mounting substrate 301. A second thermistor 232 is arranged near one side surface of the third IC chip 123 mounted on the second mounting substrate 302. A third thermistor 233 and a fourth thermistor 234 are respectively arranged near side surfaces of the second IC chip 122 mounted on the first mounting substrate 301, the side surfaces facing each other. Moreover, for example, a fifth thermistor 234a is arranged on a side surface of the first battery 10A, and a sixth thermistor 234b is arranged on a side surface of the second battery 10B.

The first thermistor 231 directly arranged on the upper surface of the first IC chip 121 can directly measure a temperature of a chip being monitored, but requires a connection by wiring 102A such as a wire. Compared to this, for example, in the case of the second thermistor 232 arranged near the side surface of the third IC chip 123, a connection by, for example, a wiring pattern 102B formed on the second mounting substrate 302 is possible.

As described above, according to Variation 2, a plurality of thermistors 233 and 234 are provided for the second IC chip 122 being monitored. In this case, monitoring under a plurality of detection conditions such as a case where one of the two thermistors 233 and 234 detects abnormality and a case where both of the thermistors 233 and 234 detect the abnormality is possible. As a result, determination of an occurrence state of abnormality is facilitated. Moreover, Variation 2 is effective also in the case where the chip being monitored has a big size and thus a heat generation place can not be specified in one place.

Moreover, in Variation 2, the third battery 10C for backup is provided. Therefore, even if supply of electric power from the first battery 10A is shut off due to abnormality, the detection data detected by the protection device 101D can be held.

Embodiment 6

Embodiment 6 according to the present invention will be described below with reference to the drawings.

Figure 9:
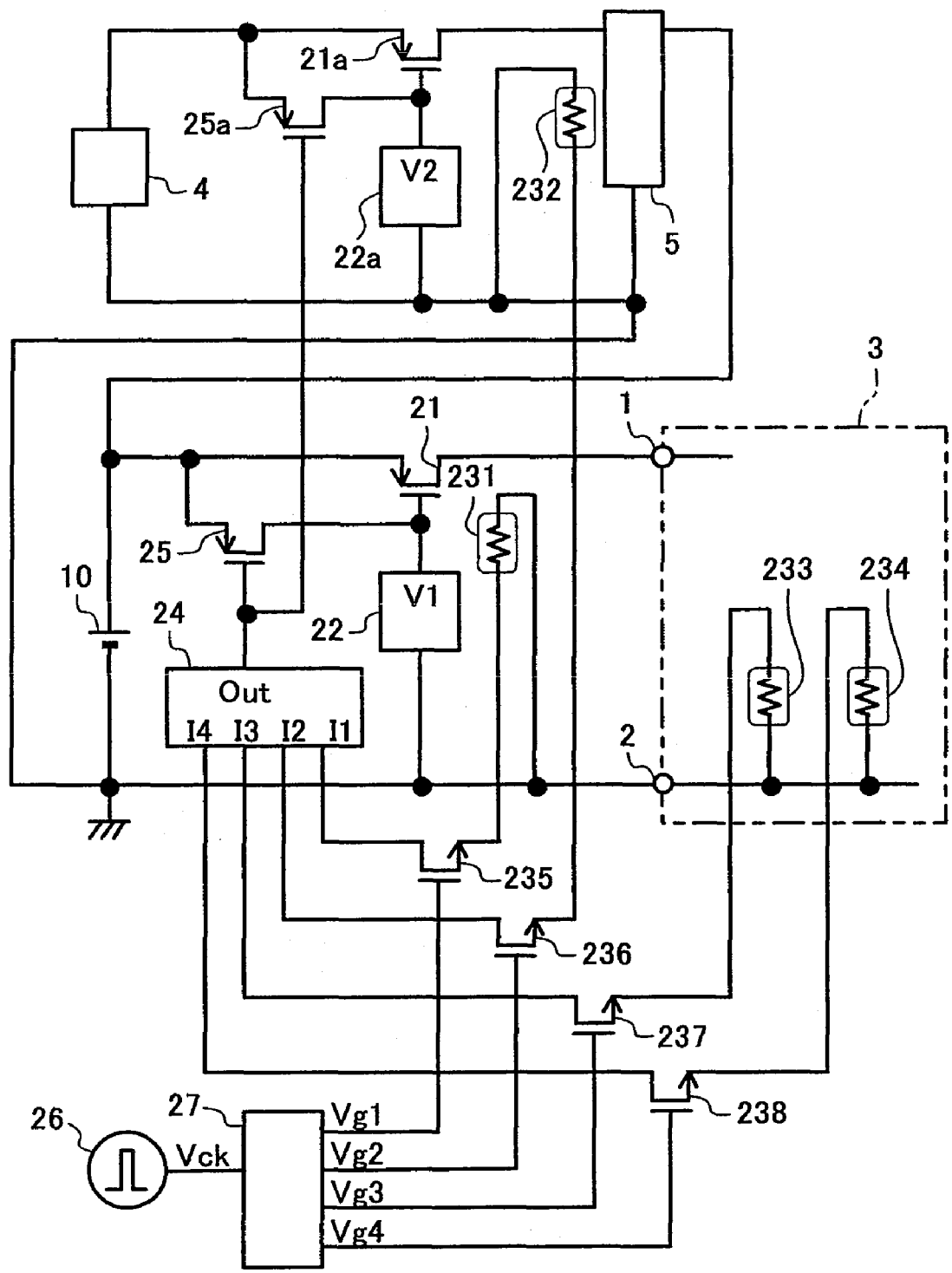
FIG. 9 is a circuit diagram illustrating a protection device according to Embodiment 6 of the present invention.

FIG. 9 shows a circuit configuration of a protection device according to Embodiment 6 of the present invention. In FIG. 9, the same components as those of the protection device of Embodiment 2 of FIG. 2 are given the same reference numerals and descriptions thereof are omitted.

The protection device according to Embodiment 6 shown in FIG. 9 is an example where the present invention is applied to a configuration of an electronic apparatus in which the battery 10 is charged with electric power from an AC adapter, an in-vehicle adapter, or the like via a charging apparatus 5.

As shown in FIG. 9, in a configuration in which the battery 10 can be charged, a voltage output from an external power source 4 is supplied to the charging apparatus 5 via a third PMOS transistor 21a. A second control circuit 22a applies a signal V2 to the gate of the third PMOS transistor 21a to control a current from the external power source 4. A fourth PMOS transistor 25a is connected between the gate and the source of the third PMOS transistor 21a.

Differences from Embodiment 2 are that the second thermistor 232 is installed on or arranged near the charging apparatus 5 to detect a temperature of the charging apparatus, and that the fourth PMOS transistor 25a connected between the gate and the source of the third PMOS transistor 21a is turned ON or OFF along with the second PMOS transistor 25 by the comparison circuit 24.

With this configuration, when temperature detection performed in monitoring places including the charging apparatus 5 results in detection of an abnormal temperature in any one of the monitoring places, the supply current from the battery 10 to the electronic apparatus 3 is shut off and the fourth PMOS transistor 25a is turned ON, causing the third PMOS transistor 21a to transition to the OFF state, which simultaneously shuts off a supply current from the external power source 4 to the charging apparatus 5.

That is, in Embodiment 6, a place where the power source is shut off is not limited to a single power source supply path. Providing a plurality of shut-off switching circuits makes a protection function effective also for an electronic apparatus including a plurality of power sources.

Embodiment 7

Embodiment 7 of the present invention will be described below with reference to the drawings.

Figure 10:
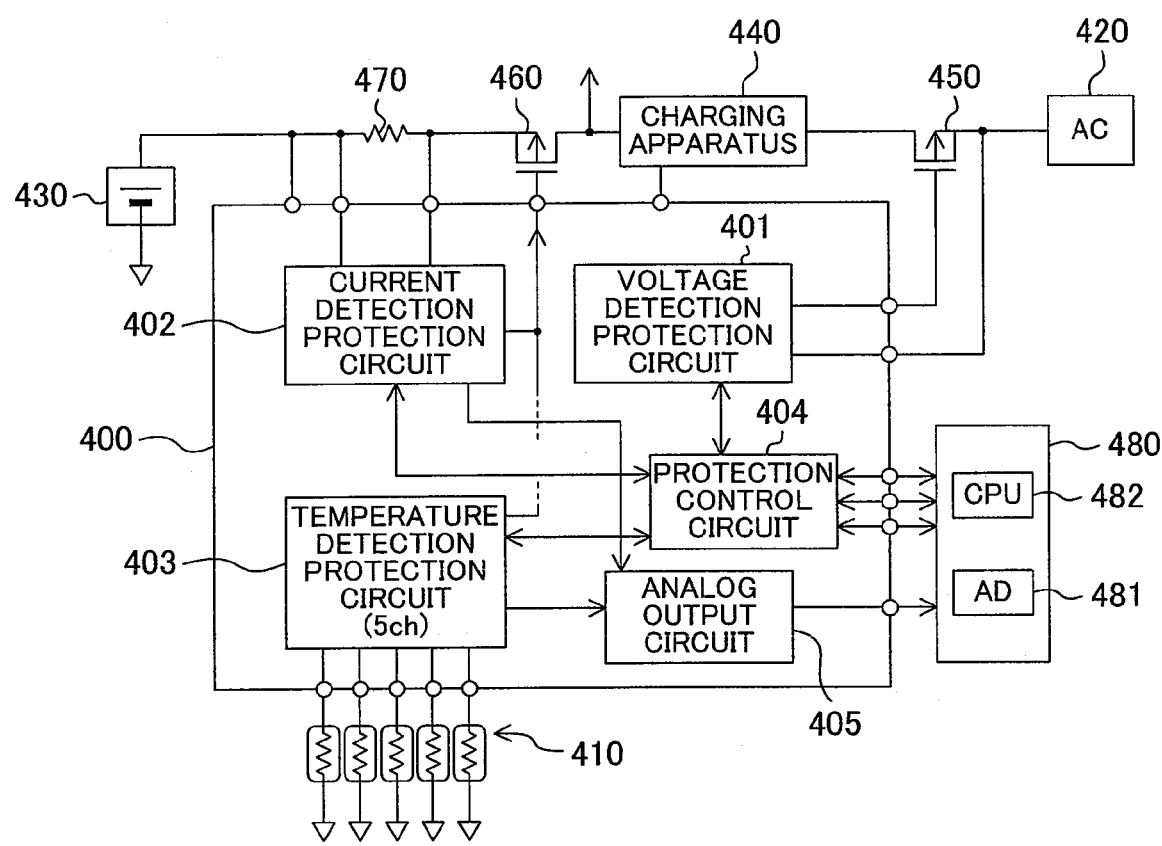
FIG. 10 is a block diagram illustrating a protection device according to Embodiment 7 of the present invention.

FIG. 10 shows a block configuration of a protection device according to Embodiment 7 of the present invention. As shown in FIG. 10, the protection device according to Embodiment 7 includes an integrated circuit 400 and five thermistors 410 for, for example, temperature detection, wherein main components are integrated in the integrated circuit 400.

The integrated circuit 400 is connected to an external power source 420 such as an AC adapter, a battery 430, a charging apparatus 440 for charging the battery 430 with a current output from the external power source 420, a first switch 450 which is provided between the external power source 420 and the charging apparatus 440 and which is, for example, an NMOS transistor, a second switch 460 which is provided between the charging apparatus 440 and the battery 430 and which is an NMOS transistor, and a resistor 470 which is provided between the battery 430 and the second switch 460.

The integrated circuit 400 is further connected to an external device 480 which includes an AD converter 481 for performing analog-digital conversion of detection data of, for example, a current and a temperature detected by the integrated circuit 400, and a CPU 482 in which the detection data digitalized by the AD converter 481 is recorded and processed.

The integrated circuit 400 includes a voltage detection protection circuit 401, a current detection protection circuit 402, a temperature detection protection circuit 403, a protection control circuit 404, and an analog output circuit 405.

The voltage detection protection circuit 401 detects an output voltage of the external power source 420. When the voltage detection protection circuit 401 detects an overvoltage, the voltage detection protection circuit 401 turns off the first switch 450.

The current detection protection circuit 402 detects a charging current or a discharging current of the battery 430 from a voltage drop across the resistor 470. When the current detection protection circuit 402 detects an overcurrent, the current detection protection circuit 402 turns off the second switch 460.

The temperature detection protection circuit 403 feeds a predetermined current to each thermistor 410 and detects an ambient temperature of each thermistor 410 from the amount of a voltage drop across the thermistor. When the temperature detection protection circuit 403 detects an overheating state, the temperature detection protection circuit 403 turns off the second switch 460.

The protection control circuit 404 controls the voltage detection protection circuit 401, the current detection protection circuit 402, and the temperature detection protection circuit 403.

The analog output circuit 405 outputs detection data detected by the current detection protection circuit 402 and the temperature detection protection circuit 403.

In FIG. 10, the protection control circuit 404 included in the protection device realizes a method for detecting a quantity of electricity according to the present invention. Specifically, protection control circuit 404 includes a clock generator for generating a clock signal having a 10-μs pulse in a cycle of 1 ms, for example, and divides the generated clock signal to sequentially drive the detection circuits 402 and the 403. In Embodiment 7, a current detection place is one place, that is, the resistor 470 and temperature detection places are five places, that is, the thermistors 410. Therefore, since each of the detection places operates during a 10-μs detection period in a cycle of 6 ms, its electric power consumption is greatly reduced compared to the case of continuous detection.

Detection data detected by the current detection protection circuit 402 and the temperature detection protection circuit 403 is output from the integrated circuit 400 included in the protection device to the external device 480 by the analog output circuit 550. The detection data captured in the external device 480 is recorded as digital data and subjected to an appropriate process.

It is to be noted that also in Embodiment 7, an AD converter, a resist, or the like may be integrated in the integrated circuit 400 included in the protection device as Variation 1 of Embodiment 5 of FIG. 7.

Figure 11A:
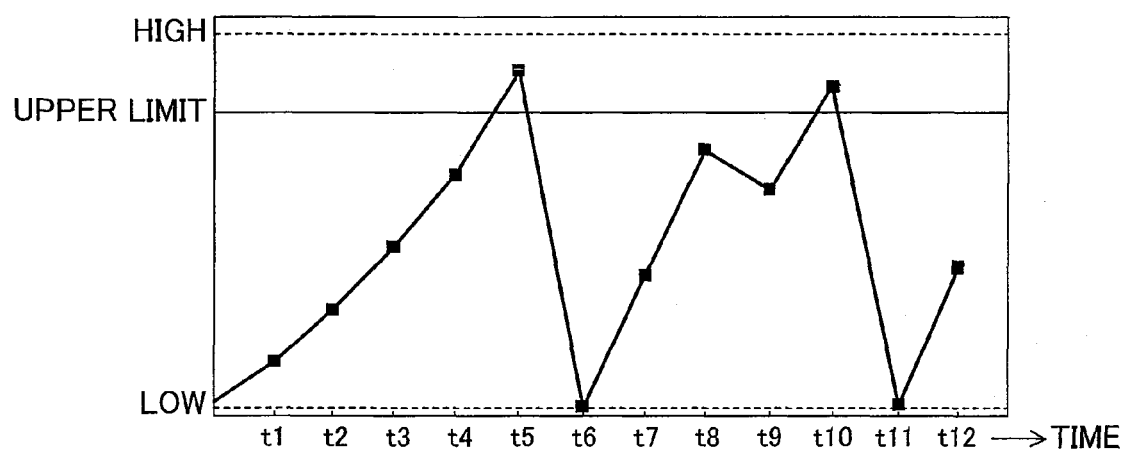
FIG. 11A is an example of a graph illustrating current detection data output from the protection device according to Embodiment 7 of the present invention.

FIG. 11A shows an example of a graph drawn based on current detection data which is output from the current detection protection circuit 402 of the protection device and recorded in the external device 480. Form FIG. 11A, it is possible to see a history as follows. The current detection protection circuit 402 detected an overcurrent exceeding an upper limit (threshold value) at a time t5, and thus turned off the second switch 460. Therefore, the current value once decreased to 0, and then the current increased due to reactivation. At a time t10, the current detection protection circuit 402 detected an overcurrent again, and thus turned off the second switch 460.

Figure 11B:
FIG. 11B is an example of a graph illustrating a temperature detection data output from the protection device according to Embodiment 7 of the present invention.
Figure 12:
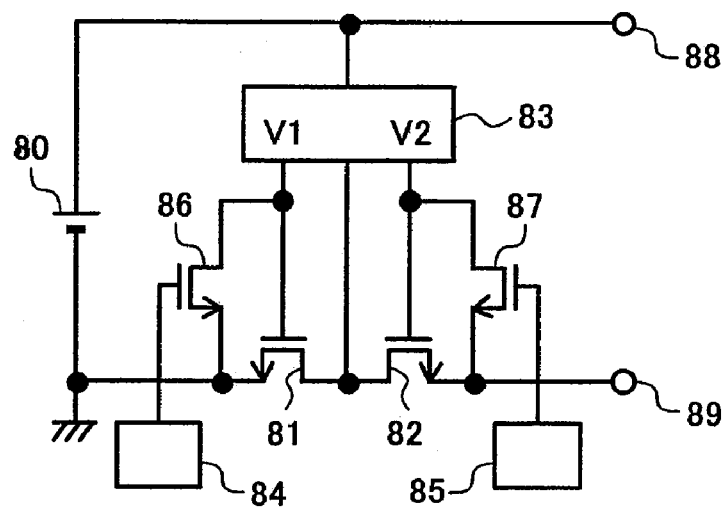
FIG. 12 is a circuit diagram illustrating a conventional protection device.

Likewise, FIG. 11B shows an example of a graph drawn based on temperature detection data output from the temperature detection protection circuit 403 of the protection device and recorded in the external device 480. The temperature detection protection circuit 403 detects a temperature in each monitoring place according to, for example, a voltage value which generates a resistance value of each thermistor 410 when a current is fed for 10 μs in a cycle of 6 ms. From FIG. 11B, it is possible to see a history as follows. The temperature detection protection circuit 403 detected a temperature exceeding an upper limit (threshold value) at a time t25, and thus turned off the second switch 460. Therefore, the temperature of the monitoring place where electric power supply was shut off lowered, and then the temperature increased due to reactivation. At a time t30, the temperature detection protection circuit 403 detected an overheating state again, and thus turned off the second switch 460.

As described above, when the integrated circuit 400 included in the protection device according to Embodiment 7 is adopted, the protection function for the electronic apparatus can be realized with low electric power consumption.

Moreover, since an operational history can be recorded, breakdown analysis and the like can be certainly performed without breaking the electronic apparatus.

In the protection device in each Embodiment of the present invention, the operation of shutting off power source supply on abnormality detection has been described as protection operation. However, after the shutoff stops operation of the electronic device and lowers the temperature or the like allowing the electronic device to get out of the abnormal state, the protection device is generally required to maintain the shutoff of the power source supply. This is not a feature of the present invention, and thus descriptions thereof are not given. However, such a configuration in which the protection device is fed with electric power directly from a battery or an external power source device and a latched circuit is provided to maintain the protection operation is self-evident.

INDUSTRIAL APPLICABILITY

In a protection device and a method for driving the same according to the present invention, detection operation is performed in synchronization with a clock signal, so that electric power consumption required for detecting abnormality can be reduced. Therefore, the protection device and the method for driving the same according to the present invention are applicable to, for example, a protection device for detecting an abnormal temperature, an abnormal current, and the like of an electronic apparatus to protect the electronic apparatus, and are applicable specifically to a protection device for a mobile phone and an in-vehicle apparatus which are used for many hours.

The invention claimed is:

1. A protection device for detecting a temperature, a voltage, or a current in a predetermined monitoring place in an electronic apparatus supplied with electric power from an external power source to protect the electronic apparatus from an excessive temperature, an overvoltage, or an overcurrent, the protection device comprising:
   a detection element arranged in the monitoring place for detecting the temperature, the voltage, or the current of the electronic apparatus to output an electric signal;
   an oscillating circuit for generating a clock signal having a predetermined cycle and a predetermined ON time; and
   a detection circuit for detecting the electric signal generated in the detection element, the detection circuit including a first switching circuit and the detection element, where the first switching circuit is connected to the detection element and switches the detection element between an active state and an inactive state,
   wherein during the ON time of the clock signal, the first switching circuit is in an ON state to switch the detection element to the active state, whereas during an OFF time of the clock signal, the first switching circuit is in an OFF state to switch the detection element to the inactive state, and
   supply of the electric power to the electronic apparatus is shut off according to an output signal output from the detection circuit.

2. The protection device of claim 1, further comprising a second switching circuit for controlling the supply of the electric power to the electronic apparatus, the second switching circuit being provided for an electric power supply line between the external power source and the electronic apparatus, wherein
   the detection element is a temperature detection element for detecting a temperature of the second switching circuit to output the electric signal according to the detected temperature, and
   the second switching circuit is turned off according to the output signal of the detection circuit.

3. The protection device of claim 1, further comprising a second switching circuit for controlling the supply of the electric power to the electronic apparatus, the second switching circuit being provided for an electric power supply line between the external power source and the electronic apparatus, wherein
   the detection element is a temperature detection element for detecting a temperature of an element constituting the electronic apparatus to output the electric signal according to the detected temperature, and
   the second switching circuit is turned off according to the output signal of the detection circuit.

4. The protection device of claim 1, further comprising a second switching circuit for controlling the supply of the electric power to the electronic apparatus, the second switching circuit being provided for an electric power supply line between the external power source and the electronic apparatus, wherein
   the detection element is a voltage detection element which is connected to the electric power supply line for detecting a voltage of the electric power supply line to output the electric signal according to the detected voltage, and
   the second switching circuit is turned off according to the output signal of the detection circuit.

5. The protection device of claim 1, further comprising a second switching circuit for controlling the supply of the electric power to the electronic apparatus, the second switching circuit being provided for an electric power supply line between the external power source and the electronic apparatus, wherein
   the detection element is a current detection element which is connected to the electric power supply line for detecting a current responsive to an output current of the external power source to output the electric signal according to the detected current, and
   the second switching circuit is turned off according to the output signal of the detection circuit.

6. The protection device of claim 1, further comprising a protection control circuit for generating an input signal during the ON time of the clock signal, the input signal being input to the detection element, wherein
   the detection element includes a plurality of detection elements arranged in N (N is an integer greater than or equal to 2) detection places, and
   the protection control circuit drives the detection elements according to N different phases synchronous with the clock signal.

7. The protection device of claim 6, wherein the protection control circuit includes a divider circuit for dividing the clock signal by at least N.

8. The protection device of claim 1, further comprising a judging circuit which includes a comparison circuit for comparing the output signal of the detection circuit with a reference signal serving as a reference and outputting a result of the comparison, wherein
   the judging circuit counts an output signal of the comparison circuit, and when a result of the count exceeds a predetermined number of times, the judging circuit shuts off the supply of the electric power to the electronic apparatus.

9. The protection device of claim 8, wherein the judging circuit further includes:
a delay circuit for outputting a signal obtained by delaying the clock signal for a predetermined time;
the detection circuit for intermittently supplying a current to the detection element according to the clock signal to output the signal generated in the detection element;
a logical circuit for performing logical AND operation of the output signal of the comparison circuit and the signal output from the delay circuit; and
a counter circuit whose reset terminal receives an output signal of the logical circuit and whose clock input terminal receives the output signal of the comparison circuit for count operation, wherein
the supply of the electric power to the electronic apparatus is shut off according to an output signal of the counter circuit.

10. The protection device of claim 1, further comprising recording means for recording a temperature, a voltage, or a current at which the supply of the electric power to the electronic apparatus is shut off.

11. The protection device of claim 10, wherein the recording means records a bigger one of data detected by the detection circuit and data in the recording means.

12. The protection device of claim 10, further comprising a central processing unit, wherein the recording means operates according to a signal given from the central processing unit.

13. The protection device of claim 12, further comprising transmission means for externally transmitting an internal signal held in the central processing unit.

14. The protection device of claim 12, wherein
the central processing unit is connected to a first power source which is detachably provided, and
the recording means is connected to a second power source which is provided independently of the first power source.

15. A protection method using a protection device for detecting a temperature, a voltage, or a current in a predetermined monitoring place in an electronic apparatus to protect the electronic apparatus from an excessive temperature, an overvoltage, or an overcurrent,
the protection device including: a detection element arranged in the monitoring place for detecting a value of the temperature, the voltage, or the current in the monitoring place; a clock generation circuit for generating a clock signal which is output from the clock generation circuit, the clock signal having a predetermined cycle and a predetermined ON time; and a current source for outputting a signal current during the ON time of the clock signal,
the protection method comprising the steps of:
switching the detection element to an active state during the ON time of the clock signal, and collecting a quantity of electricity generated by applying the signal current to the detection element;
switching the detection element to an inactive state during the OFF time of the clock signal; and
protecting the electronic apparatus according to the collected quantity of the electricity.

16. A method for processing a signal using a protection device for detecting a temperature, a voltage, or a current in a predetermined monitoring place in an electronic apparatus to protect the electronic apparatus from an excessive temperature, an overvoltage, or an overcurrent, the method comprising the steps of:
generating a clock signal having a predetermined cycle and a predetermined ON time;
detecting the temperature, the voltage, or the current in the monitoring place during the ON time of the clock signal, but not detecting the temperature, the voltage, or the current in the monitoring place during an OFF time of the clock signal;
shutting off supply of electric power to the electronic apparatus according to an output signal of a detection circuit; and
recording output data from temperature detection means, voltage detection means, or current detection means at a time when the supply of the electric power is shut off according to the output signal of the detection circuit,
wherein a detection element utilized to detect the temperature is switched off during the OFF time of the clock signal.

17. The method of claim 16, further comprising the step of transferring the output data to a central processing unit provided outside.

18. A method for detecting a quantity of electricity using a protection device for detecting a temperature, a voltage, or a current in a predetermined monitoring place in an electronic apparatus to protect the electronic apparatus from an excessive temperature, an overvoltage, or an overcurrent,
the protection device including: a detection element arranged in the monitoring place for detecting a value of the temperature, the voltage, or the current in the monitoring place; a clock generation circuit for generating a clock signal which is output from the clock generation circuit, the clock signal having a predetermined cycle and a predetermined ON time; and a current source for outputting a signal current during the ON time of the clock signal,
the method comprising the steps of:
(a) switching the detection element to an active state during the ON time of the clock signal, and applying the signal current to the detection element;
(b) during the OFF time of the clock signal, the signal current applied to the detection element is shut off to switch the detection element to an inactive state; and
(c) detecting the quantity of the electricity generated from the detection element due to the application of the signal current.

19. The method of claim 18, wherein
the monitoring place includes a plurality of monitoring places provided in the electronic apparatus,
the detection element includes a plurality of detection elements respectively arranged in the plurality of monitoring places,
step (a) includes sequentially applying the signal current from the current source to the plurality of the detection elements; and
step (b) includes sequentially detecting the quantity of the electricity generated from each of the detection elements due to the sequential application of the signal current.

* * * * *